(12) United States Patent
Yang et al.

(10) Patent No.: US 12,261,247 B2
(45) Date of Patent: Mar. 25, 2025

(54) PIXEL AND DISPLAY DEVICE INCLUDING THE SAME

(71) Applicant: Samsung Display Co., Ltd., Yongin-si (KR)

(72) Inventors: Eun A Yang, Yongin-si (KR); Han Su Kim, Yongin-si (KR); Woong Bae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 694 days.

(21) Appl. No.: 17/444,614

(22) Filed: Aug. 6, 2021

(65) Prior Publication Data

US 2022/0052228 A1 Feb. 17, 2022

(30) Foreign Application Priority Data

Aug. 11, 2020 (KR) ........................ 10-2020-0100769

(51) Int. Cl.
*H01L 33/44* (2010.01)
*H01L 25/075* (2006.01)
*H01L 33/38* (2010.01)

(52) U.S. Cl.
CPC .......... *H01L 33/44* (2013.01); *H01L 25/0753* (2013.01); *H01L 33/38* (2013.01)

(58) Field of Classification Search
CPC ..... H01L 33/44; H01L 25/0753; H01L 33/38; H01L 33/20; H01L 33/62; H01L 25/167;
(Continued)

(56) References Cited

U.S. PATENT DOCUMENTS 8,872,214 B2 10/2014 Negishi et al.
9,112,112 B2 8/2015 Do et al.
(Continued)

FOREIGN PATENT DOCUMENTS

KR 10-1244926 B1 3/2013
KR 10-1490758 B1 2/2015
(Continued)

OTHER PUBLICATIONS

International Search Report dated Nov. 25, 2021 for corresponding Korean PCT Application No. PCT/KR2021/010510 (3 pages).

*Primary Examiner* — Cuong B Nguyen
(74) *Attorney, Agent, or Firm* — Womble Bond Dickinson (US) LLP

(57) ABSTRACT

A display device includes a base layer including a pixel area, and a pixel in the pixel area. The pixel includes a first area, and a second area enclosing the first area in a plan view, bank patterns at the pixel area, extending in a first direction, spaced from each other by a first distance in the first area, and spaced from each other by a third distance that is greater than the first distance in the second area, a first electrode and a second electrode at an area of the bank patterns, and spaced from each other by a second distance that is less than the first distance in the first area, a first insulating layer at a portion of the pixel area including the first area to cover the first electrode and the second electrode and removed from another portion of the pixel area including opposite edge portions.

20 Claims, 19 Drawing Sheets

(58) Field of Classification Search
CPC . H01L 27/156; H01L 27/1218; H01L 27/124; H01L 27/1262
See application file for complete search history.

(56) References Cited

U.S. PATENT DOCUMENTS

| | | |
|---|---|---|
| 9,252,375 B2 | 2/2016 | Bibl et al. |
| 9,773,761 B2 | 9/2017 | Do |
| 10,903,195 B2 | 1/2021 | Choi et al. |
| 11,978,834 B2 | 5/2024 | Li et al. |
| 12,074,171 B2 | 8/2024 | Oh et al. |
| 12,166,022 B2 | 12/2024 | Li et al. |
| 2011/0089850 A1 | 4/2011 | Shibata et al. |
| 2020/0043976 A1 | 2/2020 | Kim et al. |
| 2023/0207608 A1* | 6/2023 | Kim ................... H01L 33/44 257/89 |
| 2023/0246133 A1* | 8/2023 | Cha ................ H01L 33/0095 257/91 |

FOREIGN PATENT DOCUMENTS

| | | |
|---|---|---|
| KR | 10-2020-0016424 A | 2/2020 |
| KR | 10-2020-0034896 A | 4/2020 |
| KR | 10-2020-0070493 A | 6/2020 |
| KR | 10-2020-0074591 A | 6/2020 |
| KR | 10-2020-0077671 A | 7/2020 |
| KR | 10-2020-0088954 A | 7/2020 |
| WO | WO 2020/149471 A1 | 7/2020 |

\* cited by examiner

PIXEL AND DISPLAY DEVICE INCLUDING THE SAME

CROSS-REFERENCE TO RELATED APPLICATION

The present application claims priority to and the benefit of Korean patent application number 10-2020-0100769 filed on Aug. 11, 2020, the entire disclosure of which is incorporated herein in its entirety by reference.

BACKGROUND

1. Field

Various embodiments of the present disclosure relate to a pixel and a display device including the pixel.

2. Description of Related Art

Recently, interest in information display is increasing. Accordingly, research and development of a display device are continuously conducted.

SUMMARY

Various embodiments of the present disclosure are directed to a pixel and a display device including the pixel, capable of controlling the supply and arrangement position of light emitting elements while simplifying a manufacturing process.

Some embodiments of the present disclosure may provide a display device including a base layer including a pixel area; and a pixel in the pixel area. The pixel may include a first area, and a second area enclosing the first area in a plan view; bank patterns at the pixel area, extending in a first direction, spaced from each other by a first distance in the first area, and spaced from each other by a third distance that is greater than the first distance in the second area; a first electrode and a second electrode at an area of the bank patterns, and spaced from each other by a second distance that is less than the first distance in the first area; a first insulating layer at a portion of the pixel area including the first area to cover the first electrode and the second electrode, and removed from another portion of the pixel area including opposite edge portions to expose the bank patterns; and a first light emitting element on the first insulating layer at the first area, and connected between the first electrode and the second electrode.

In some embodiments, the bank patterns may have a first width extended in a second direction crossing the first direction at an area corresponding to the first area, and a second width extended in the second direction at an area corresponding to the second area, the second width being less than the first width.

In some embodiments, the bank patterns may include a first bank pattern at a first edge portion of the pixel area and extended from the first edge portion to the first area; and a second bank pattern at a second edge portion of the pixel area that is opposite to the first bank pattern, and extended from the second edge portion to the first area.

In some embodiments, the first insulating layer may overlap an area of the first bank pattern and the second bank pattern in a central portion of the pixel area including the first area, and may expose another area of the first bank pattern and the second bank pattern in a remaining portion of the pixel area.

In some embodiments, the first bank pattern and the second bank pattern may be integrally connected to each other in at least one of a third edge portion and a fourth edge portion of the pixel area, and may completely enclose an emission area of the pixel including the first area in a plan view.

In some embodiments, the pixel may further include a third electrode that is opposite to the first electrode with the second electrode interposed therebetween, a fourth electrode between the second electrode and the third electrode, and a second light emitting element at the first area on the first insulating layer and connected between the third electrode and the fourth electrode. The first bank pattern and the second bank pattern may partially overlap the first electrode and the third electrode, respectively. The bank patterns may further include a third bank pattern between the first bank pattern and the second bank pattern and partially overlapping the second electrode and the fourth electrode.

In some embodiments, the pixel may further include a first contact electrode on the first electrode, and connecting a first end of the first light emitting element to the first electrode; and a second contact electrode on the second electrode and connecting a second end of the first light emitting element to the second electrode.

In some embodiments, the first contact electrode and the second contact electrode may be connected to the first electrode and the second electrode, respectively, through respective contact holes in the first insulating layer in the second area.

In some embodiments, the first area may include a first sub-emission area including the first electrode, the second electrode, and the first light emitting element; and a second sub-emission area spaced the first sub-emission area, and including a third electrode, a fourth electrode, and a second light emitting element connected between the third and fourth electrodes.

In some embodiments, the pixel may further include a contact electrode extended from the first sub-emission area to the second sub-emission area, and connecting the second electrode to the third electrode.

In some embodiments, the first insulating layer may include a hydrophilic surface, and the bank patterns may include a hydrophobic surface.

In some embodiments, the first insulating layer may extend in the first direction in the pixel area, and may overlap the bank patterns in the central portion of the pixel area.

In some embodiments, the first electrode and the second electrode may be in the first and second areas, may be opposite to each other and spaced from each other by the second distance in the first area, and may be opposite to each other and spaced from each other by a fourth distance that is greater than the second distance in the second area.

In some embodiments, the first insulating layer may have a non-uniform width within the pixel area according to shape and spacing of the first electrode and the second electrode.

In some embodiments, a valley may be formed in the central portion of the pixel area by the bank patterns, and the valley may have a minimum width in the first area.

In some embodiments, the display device further includes light emitting elements that include the first light emitting element within the valley in the first area.

In some embodiments, the first insulating layer may completely cover the first electrode and the second electrodes in the first area.

In some embodiments, the bank patterns may be at a same layer on a surface of the base layer.

In some embodiments, the bank patterns may be at a same height with respect to the surface of the base layer.

Some embodiments of the present disclosure may provide a pixel, including a first area; a second area enclosing the first area in a plan view; bank patterns extending in a pixel area in a first direction, spaced from each other by a first distance in the first area, and spaced from each other by a third distance that is greater than the first distance in the second area; a first electrode and a second electrode at an area of the bank patterns, and spaced from each other by a second distance that is less than the first distance in the first area; a first insulating layer in a portion of the pixel area including the first area to cover the first and second electrodes, and removed from another portion of the pixel area including opposite edge portions of the pixel area to expose the bank patterns; and a first light emitting element arranged in the first area on the first insulating layer, and connected between the first electrode and the second electrode.

Details of various embodiments are included in the detailed description and the drawings.

DETAILED DESCRIPTION

Figure 1A:
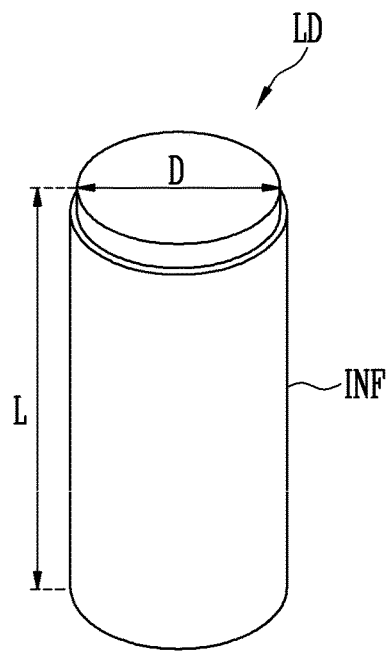
FIG. 1A is a perspective view illustrating a light emitting element in accordance with some embodiments of the present disclosure.

Reference will now be made in detail to various embodiments of the present disclosure, specific examples of which are illustrated in the accompanying drawings and described below, because the embodiments of the present disclosure can be variously modified in many different forms. Furthermore, a singular form may include a plural from as long as it is not specifically mentioned in a sentence.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

The present disclosure is not limited to the following embodiments and may be modified into various forms. Furthermore, an embodiment or example described below may be implemented alone or in combination with at least one different embodiment or example.

Some elements which are not directly related to the features of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

Figure 1B:
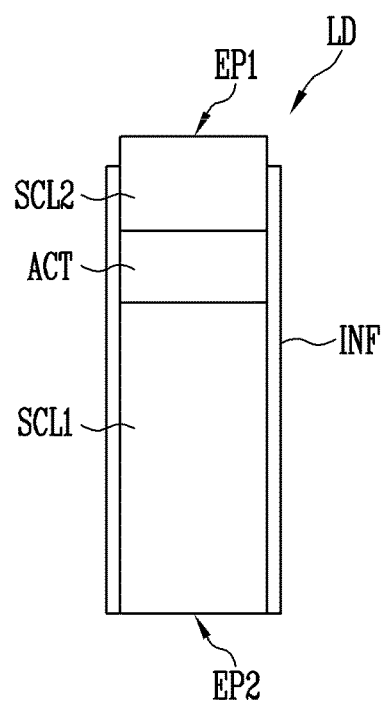
FIGS. 1B-1D are sectional views each illustrating the light emitting element in accordance with some embodiments of the present disclosure.
Figure 1C:
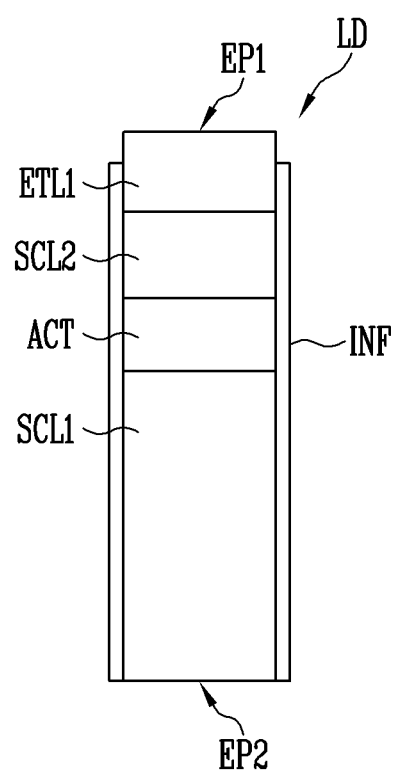
Figure 1D:
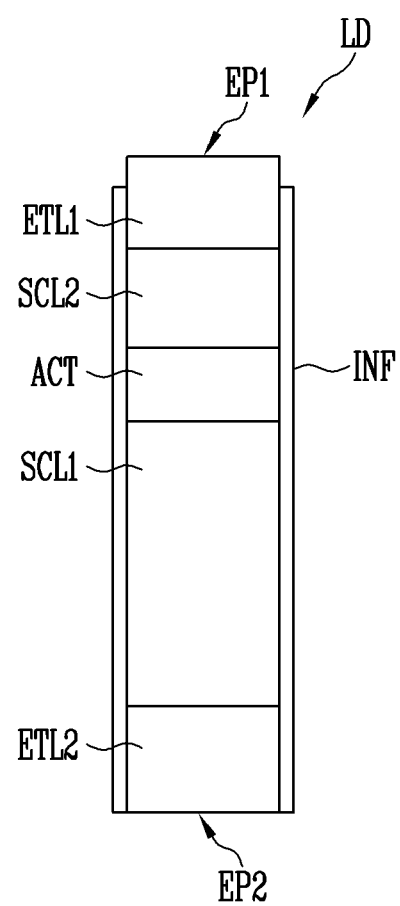

FIG. 1A is a perspective view illustrating a light emitting element LD in accordance with some embodiments of the present disclosure. FIGS. 1B-1D are sectional views each illustrating the light emitting element LD in accordance with some embodiments of the present disclosure. For example, FIGS. 1B-1D illustrate different embodiments of the configuration of the light emitting element LD of FIG. 1A. Although a rod-type light emitting element LD of a cylindrical shape is illustrated in FIGS. 1A-1D, the type and/or shape of the light emitting element LD according to the present disclosure are not limited thereto.

Referring to FIGS. 1A-1D, the light emitting element LD includes a first semiconductor layer SCL1, a second semiconductor layer SCL2, and an active layer ACT interposed between the first and second semiconductor layers SCL1 and SCL2. For example, the light emitting element LD may include the first semiconductor layer SCL1, the active layer ACT, and the second semiconductor layer SCL2 which are successively stacked in a longitudinal direction L.

The light emitting element LD may be provided in the shape of a rod extending in one direction. If the direction in which the light emitting element LD extends is defined as a longitudinal direction L, the light emitting element LD may have a first end EP1 and a second end EP2 with respect to the longitudinal direction L.

One of the first and second semiconductor layers SCL1 and SCL2 may be on the first end EP1 of the light emitting element LD. Furthermore, the remaining one of the first and second semiconductor layers SCL1 and SCL2 may be on the second end EP2 of the light emitting element LD. For example, the second semiconductor layer SCL2 and the first semiconductor layer SCL1 may be on the first end EP1 and the second end EP2 of the light emitting element LD, respectively.

In some embodiments, the light emitting element LD may be a rod-type light emitting element (e.g., referred to as a "rod-type light emitting diode") manufactured in the shape of a rod through an etching method. In the present disclosure, the term "rod-type" embraces a rod-like shape and a bar-like shape such as a cylindrical shape and a prismatic shape extending in the longitudinal direction L (i.e., to have an aspect ratio greater than 1), and the cross-sectional shape thereof is not limited to a particular shape. For example, a length L of the light emitting element LD may be greater than a diameter D thereof (or a width of the cross-section thereof).

The light emitting element LD may have a small size corresponding to a nano-scale or a micro-scale. For example, the light emitting element LD may have a diameter D (or width D) and/or a length L in the range of a nano-scale to a micro-scale. However, in the present disclosure, the size of the light emitting element LD is not limited thereto. For example, the size of the light emitting element LD may be changed depending on design conditions of various devices, e.g., a display device, which employs, as a light source, a light emitting device using the light emitting element LD.

The first semiconductor layer SCL1 may be a first conductive semiconductor layer. For example, the first semiconductor layer SCL1 may include an N-type semiconductor layer. For example, the first semiconductor layer SCL1 may include an N-type semiconductor layer which includes any one semiconductor material from among InAlGaN, GaN, AlGaN, InGaN, AlN, and InN and is doped with a first conductive dopant such as Si, Ge, or Sn. Furthermore, the first semiconductor layer SCL1 may be formed of various different materials.

The active layer ACT may be located on the first semiconductor layer SCL1, and may be formed in a single-quantum well structure or a multi-quantum well structure. The location of the active layer ACT may be changed in various ways depending on the type of the light emitting element LD. The active layer ACT may emit light having a wavelength ranging from 400 nm to 900 nm, and may use a double hetero structure.

A cladding layer doped with a conductive dopant may be formed above and/or under the active layer ACT. For example, the cladding layer may be formed of an AlGaN layer or an InAlGaN layer. In some embodiments, a material such as AlGaN or AlInGaN may be used to form the active layer ACT, and the active layer ACT may be formed of various other materials.

The second semiconductor layer SCL2 may be on the active layer ACT and include a semiconductor layer having a type different from that of the first semiconductor layer SCL1. For example, the second semiconductor layer SCL2 may include a P-type semiconductor layer. For example, the second semiconductor layer SCL2 may include a P-type semiconductor layer which includes any one semiconductor material from among InAlGaN, GaN, AlGaN, InGaN, AlN, and InN, and is doped with a second conductive dopant such as Mg. Furthermore, the second semiconductor layer SCL2 may be formed of various different materials.

In some embodiments, the first semiconductor SCL1 and the second semiconductor layer SCL2 may have different lengths (or thicknesses) in the longitudinal direction L of the light emitting element LD. For example, the first semiconductor layer SCL1 may have a length (or a thickness) greater than that of the second semiconductor layer SCL2 in the longitudinal direction L of the light emitting element LD. Thus, the active layer ACT of the light emitting element LD may be positioned relatively closer to the first end EP1 than the second end EP2.

If a voltage equal to or greater than a threshold voltage is applied between the opposite ends of the light emitting element LD, the light emitting element LD emits light by coupling electron-hole pairs in the active layer ACT. Because light emission of the light emitting element LD can be controlled based on the foregoing principle, the light emitting element LD may be used as a light source of various light emitting devices as well as a pixel of the display device.

In some embodiments, the light emitting element LD may further include additional other components as well as the first conductive semiconductor layer SCL1, the active layer ACT, the second conductive semiconductor layer SCL2, and/or the insulating film INF enclosing them. For example, the light emitting element LD may further include at least one fluorescent layer, at least one active layer, at least one semiconductor layer and/or at least one electrode layer located on one end of the first conductive semiconductor layer SCL1, the active layer ACT, and/or the second conductive semiconductor layer SCL2.

For example, as illustrated in FIG. 1C, the light emitting element LD may further include an electrode layer ETL1 located on one side of the second semiconductor layer SCL2. In this case, the electrode layer ETL1 may be located at the first end EP1 of the light emitting element LD.

Furthermore, as illustrated in FIG. 1D, the light emitting element LD may further include another electrode layer ETL2 located on one side of the first semiconductor layer SCL1. For example, the electrode layers ETL1 and ETL2 may be located on the first and second ends EP1 and EP2 of the light emitting element LD, respectively.

The electrode layers ETL1 and ETL2 may be Ohmic contact electrodes, but they are not limited thereto. For example, the electrode layers ETL1 and ETL2 may be Schottky contact electrodes.

The electrode layers ETL1 and ETL2 may include metal or conductive oxide. For example, the electrode layers ETL1 and ETL2 may be formed of chromium (Cr), titanium (Ti), aluminum (Al), gold (Au), nickel (Ni), oxide or alloy thereof, or ITO alone or by mixture. Materials included in the respective electrode layers ETL1 and ETL2 may be same as or different from each other.

The electrode layers ETL1 and ETL2 may be substantially transparent or translucent. Thereby, light generated from the light emitting element LD may be emitted to the outside of the light emitting element LD after passing through the electrode layers ETL1 and ETL2. In some embodiments, in the case where light generated from the light emitting element LD is emitted outside the light emitting element LD through an area other than the opposite ends (e.g., the first and second ends EP1 and EP2) of the light emitting element LD rather than passing through the electrode layers ETL1 and ETL2, the electrode layers ETL1 and ETL2 may be opaque.

In some embodiments, the light emitting element LD may further include an insulating film INF on the surface of the light emitting element LD. The insulating film INF may be formed on the surface of the light emitting element LD to enclose an outer peripheral surface (e.g., an outer circumferential surface) of at least the active layer ACT. In some embodiments, the insulating film may further enclose an area of each of the first and second semiconductor layers SCL1 and SCL2.

When the light emitting element LD includes the electrode layers ETL1 and ETL2, the insulating film INF may at least partially enclose or may not enclose the outer periphery (e.g., an outer circumference) of each of the electrode layers ETL1 and ETL2. In other words, the insulating film INF may be selectively formed on the surfaces of the electrode layers ETL1 and ETL2.

The insulating film INF may expose the opposite ends (e.g., the first and second ends EP1 and EP2) of the light emitting element LD in the longitudinal direction L of the light emitting element LD. For example, the insulating film INF may expose at least one of the first and second semiconductor layers SCL1 and SCL2 and the electrode layers ETL1 and ETL2, in the first and second ends EP1 and EP2 of the light emitting element LD. In some embodiments, the insulating film INF may not be provided on the light emitting element LD.

If the insulating film INF is provided to cover the surface (e.g., outer peripheral surface) of the light emitting element LD, for example, on the outer periphery (e.g., outer circumference) of the active layer ACT, the active layer ACT may be prevented from short-circuiting with at least one electrode, e.g., a pixel electrode and/or a contact electrode that will be described later. Therefore, the electrical stability of the light emitting element LD may be secured. In describing the embodiments of the present disclosure, the term "connection (or coupling)" may generally mean physical and/or electrical connection (or coupling). Furthermore, this may generally refer to direct or indirect connection (or coupling) and integrated or non-integrated connection (or coupling).

The insulating film INF may include transparent insulating material. For example, the insulating film INF may include at least one insulating material from among $SiO_2$ or silicon oxide (SiOx), $Si_3N_4$ or silicon nitride (SiNx), $Al_2O_3$ or aluminum oxide (AlxOy), and $TiO_2$ or titanium oxide (TiOx) not determined therein, but is not limited thereto. The material of the insulating film INF is not limited to a particular material.

If the insulating film INF is provided on the surface of the light emitting element LD, occurrence of a defect on the surface of the light emitting element LD may be reduced or minimized, whereby the lifetime and efficiency of the light emitting element may be improved. In some embodiments, if the insulating film INF is formed on each light emitting element LD, even when a plurality of light emitting elements LD are located adjacent to each other, the undesired short-circuiting between the adjacent light emitting elements LD may be prevented.

In some embodiments of the present disclosure, a surface treatment process may be performed to fabricate the light emitting element LD. For example, the light emitting element LD may be surface-treated so that, when a plurality of light emitting elements LD are mixed with a fluidic solution (or solvent) and then supplied to each emission area (e.g., an emission area of each pixel), the light emitting elements LD can be evenly distributed rather than unevenly aggregating in the solution. According to some embodiments, the insulating film INF itself may be formed of a hydrophobic film using hydrophobic material, or the hydrophobic film of the hydrophobic material may be further formed on the insulating film INF.

A light emitting device including the light emitting element LD may be used in various devices including a display device which requires a light source. For example, a plurality of light emitting elements LD may be located in each pixel of a display panel, and the light emitting elements LD may be used as a light source of the pixel. However, the application field of the light emitting element LD is not limited to the above-mentioned examples. For example, the light emitting element LD may also be used in various devices such as a lighting device, which requires a light source.

Figure 2:
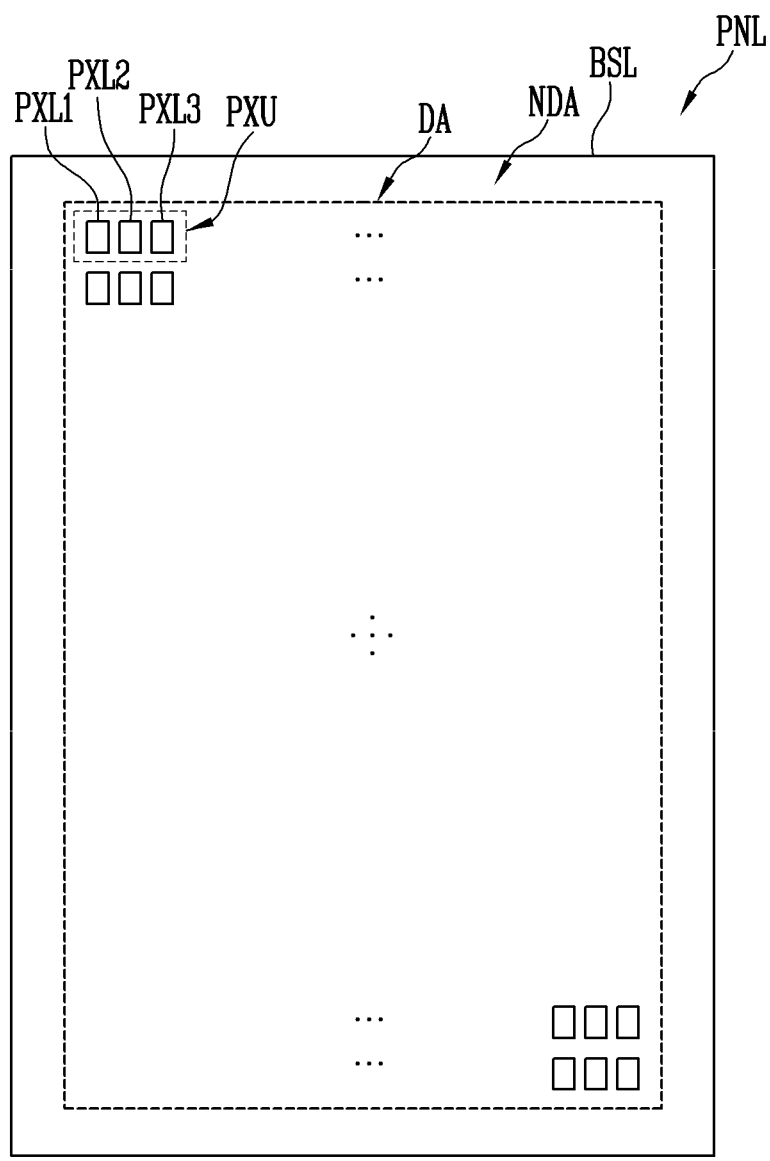
FIG. 2 is a plan view illustrating a display device in accordance with some embodiments of the present disclosure.

FIG. 2 is a plan view illustrating a display device in accordance with some embodiments of the present disclosure. FIG. 2 illustrates a display device, for example, a display panel PNL provided in the display device, as an example of an electronic device which may use, as a light source, the light emitting element LD described with reference to FIGS. 1A-1D. For example, each unit PXU of the display panel PNL and each pixel constituting the unit PXU may include at least one light emitting element LD.

For example, FIG. 2 illustrates the structure of the display panel PNL, focused on a display area DA. However, in some embodiments, at least one drive circuit, lines and/or pads may be further located on the display panel PNL.

Referring to FIG. 2, the display panel PNL in accordance with some embodiments of the present disclosure may include a base layer BSL and pixels PXL located on the base layer BSL. The pixels may include first color pixels PXL1, second color pixels PXL2, and/or third color pixels PXL3. Hereinafter, when referring to any one or more of the first color pixels PXL1, the second color pixels PXL2, and the third color pixels PXL3 or when collectively referring to two or more types of pixels, they are referred to as "pixel(s) PXL".

The display panel PNL and the base layer BSL for forming the display panel PNL may include a display area DA for displaying an image, and a non-display area NDA formed in an area (e.g., a set area or a predetermined area) other than the display area DA of the display panel PNL.

The display area DA may be located in a central portion of the display panel PNL, and the non-display area NDA may be located in a perimeter portion of the display panel PNL to enclose the display area DA. For example, the non-display area NDA may surround the display area DA along the periphery of the display area DA. The locations of the display area DA and the non-display area NDA may be changed. The display area DA may form a screen on which an image is displayed, while the non-display area NDA may be an area other than the display area DA.

The base layer BSL may form a base member of the display panel PNL, and may be a rigid or soft substrate or film. For example, the base layer BSL may be a rigid substrate made of glass or reinforced glass, a soft substrate (or a thin film) made of plastic or metal material, or at least one insulating layer. The material and/or physical properties of the base layer BSL are not particularly limited.

An area on the base layer BSL may be defined as the display area DA in which the pixels PXL are located, and the other area thereof may be defined as the non-display area NDA. For example, the base layer BSL may include the display area DA including a plurality of pixel areas on which the respective pixels PXL are formed, and the non-display area NDA located outside the display area DA. Various lines, pads, and/or internal circuit components which are connected to the pixels PXL of the display area DA may be located in the non-display area NDA.

The pixels PXL may be arranged in the display area DA. For example, the pixels PXL may be regularly arranged in the display area DA according to a stripe or PENTILE® arrangement structure. This pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In some embodiments, the pixels PXL may be arranged in various structures and/or methods in the display area DA.

In some embodiments, at least two types of pixels PXL emitting light of different colors may be located in the display area DA. For example, first color pixels PXL1 emitting light of a first color, second color pixels PXL2 emitting light of a second color, and third color pixels PXL3 emitting light of a third color may be arranged in the display area DA. Furthermore, at least one first color pixel PXL1, at least one second color pixel PXL2, and at least one third color pixel PXL3 that are located adjacent to each other may form one unit PXU which may emit light having various colors.

In some embodiments, the first color pixel PXL1 may be a red pixel which emits red light, the second color pixel PXL2 may be a green pixel which emits green light, and the third color pixel PXL3 may be a blue pixel which emits blue light. In some embodiments, the first color pixel PXL1, the second color pixel PXL2, and the third color pixel PXL3 may include, as light sources, a light emitting element related to the first color, a light emitting element related to the second color, and a light emitting element related to the third color, so that the pixels may respectively emit light having the first color, light having the second color, and light having the third color. In some embodiments, the first color pixel PXL1, the second color pixel PXL2, and the third color pixel PXL3 may respectively include light emitting elements having the same color, and photo conversion layers having different colors and/or a color filter are located on the respective light emitting elements to emit light having the first color, light having the second color, and light having the third color.

However, the colors, the types, and/or the number of pixels PXL that form each unit PXU are not particularly limited. For example, the color of light emitted by each pixel PXL may be variously changed.

The pixel PXL may include at least one light source which is driven by a control signal (e.g., a set control signal or a predetermined control signal (e.g., a scan signal and a data signal)) and/or a power supply (e.g., a set power supply or a predetermined power supply (e.g., a first power supply and a second power supply)). In some embodiments, the light source may include at least one light emitting element LD according to the embodiments of FIGS. 1A-1D, e.g., at least one rod-type light emitting element LD having a small size corresponding to a nano-scale or a micro-scale. In some embodiments, various types of light emitting elements may be used as the light source of the pixel PXL. For example, in some embodiments, the light source of each pixel PXL may be formed using a light emitting element having a core-shell structure.

Furthermore, the pixel PXL may have a structure according to at least one of the embodiments which will be described below. For example, each pixel PXL may have a structure to which at least one of the following embodiments is applied.

In some embodiments, the pixel PXL may be configured as an active pixel, but is not limited thereto. For example, the pixel PXL may be configured as a pixel of passive or active light emitting display devices having various structures and/or driving methods.

Figure 3A:
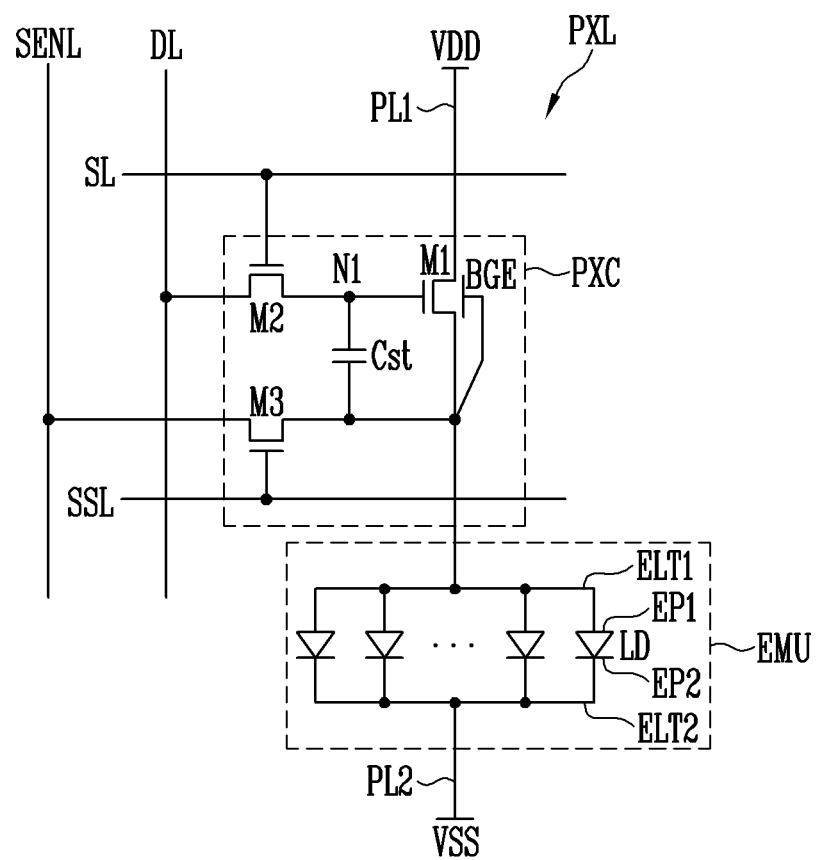
FIGS. 3A-3C are circuit diagrams each illustrating a pixel in accordance with some embodiments of the present disclosure.
Figure 3B:
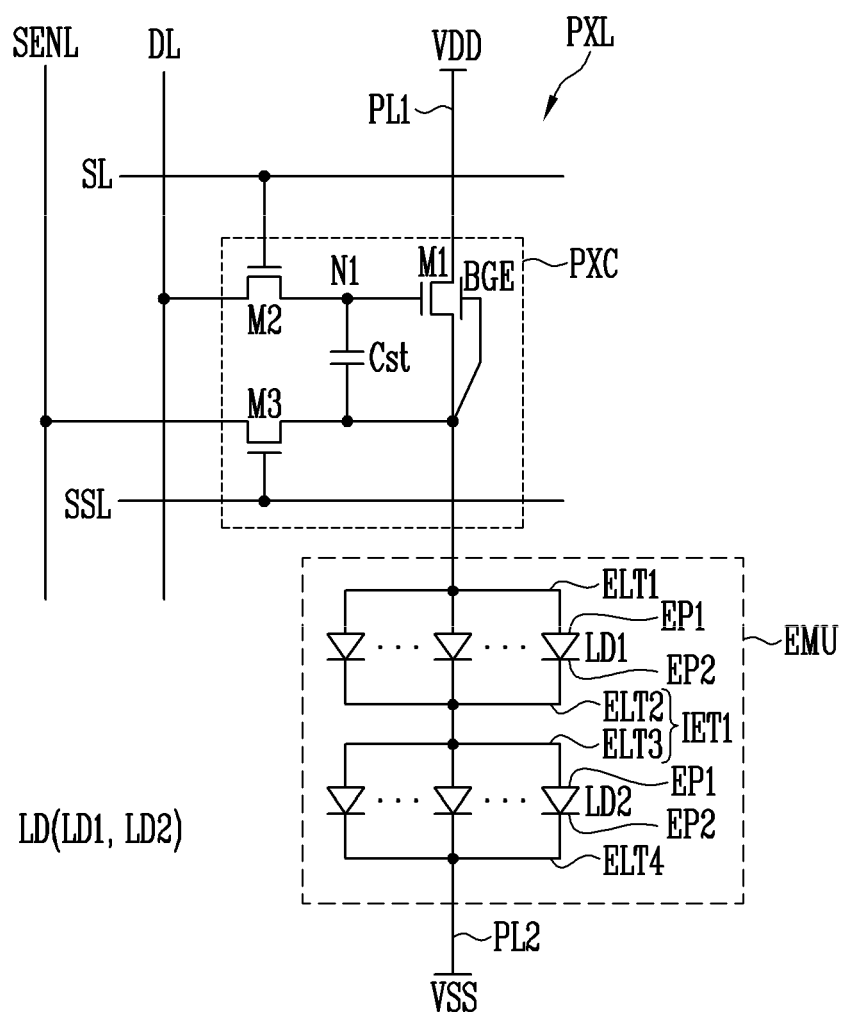
Figure 3C:
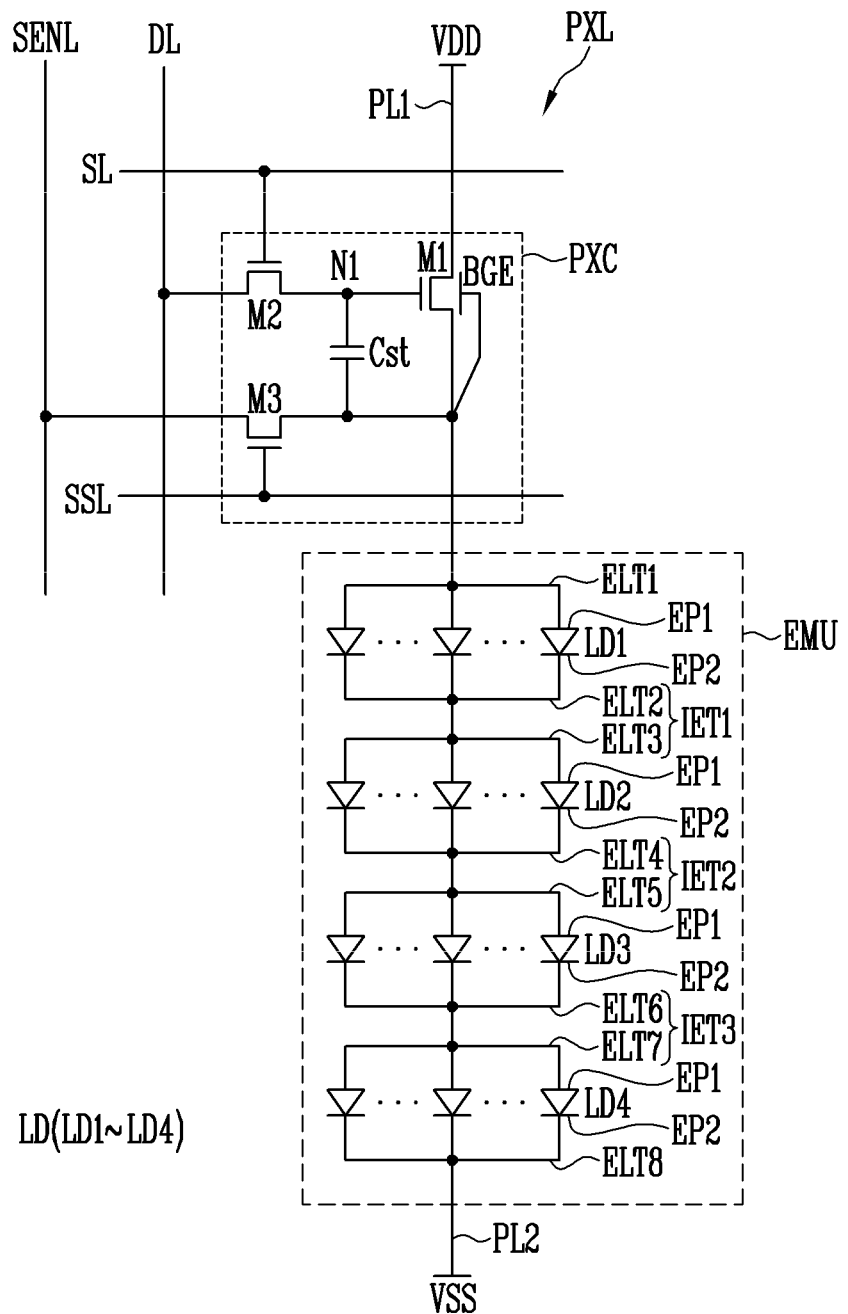

FIGS. 3A-3C are circuit diagrams each illustrating a pixel PXL in accordance with some embodiments of the present disclosure. For example, FIGS. 3A-3C illustrate embodiments of the pixel PXL which may be applied to the active display device, and illustrate different embodiments related to the structure of a light emitting unit (e.g., a group of light emitting elements LD) EMU.

In some embodiments, each pixel PXL shown in FIGS. 3A-3C may be any one of the first color pixel PXL1, the second color pixel PXL2, and the third color pixel PXL3 provided in the display panel PNL of FIG. 2. Furthermore, the first color pixel PXL1, the second color pixel PXL2, and the third color pixel PXL3 may substantially have the same or similar structure.

Referring to FIGS. 3A-3C, the pixel PXL includes the light emitting unit EMU for generating light having luminance corresponding to the data signal. Furthermore, the pixel PXL may further include a pixel circuit PXC configured to drive the light emitting unit EMU.

The pixel circuit PXC may be connected between the first power supply VDD and the light emitting unit EMU. Furthermore, the pixel circuit PXC may be connected to the scan line SL and the data line DL of the corresponding pixel PXL to control the operation of the light emitting unit EMU in response to the scan signal and the data signal supplied from the scan line SL and the data line DL. Furthermore, the pixel circuit PXC may be selectively connected to a sensing signal line SSL and a sensing line SENL.

In describing the embodiments of the present disclosure, the term "connection (or coupling)" may generally refer to physical and/or electrical connection (or coupling). Furthermore, this may generally refer to direct or indirect connection (or coupling) and integrated or non-integrated connection (or coupling).

The pixel circuit PXC may include at least one transistor and capacitor. For example, the pixel circuit PXC may include a first transistor M1, a second transistor M2, a third transistor M3, and a storage capacitor Cst.

The first transistor M1 is connected between the first power supply VDD and the first electrode ELT1 of the light emitting unit EMU. Furthermore, a gate electrode of the first transistor M1 is connected to a first node N1. The first transistor M1 may control driving current supplied to the light emitting unit EMU in response to the voltage of the first node N1. In other words, the first transistor M1 may be a drive transistor (or a driving transistor) that controls the driving current of the pixel PXL.

Furthermore, the first transistor M1 may selectively include a back gate electrode BGE. The gate electrode and the back gate electrode BGE of the first transistor M1 may overlap each other with the insulating layer being interposed therebetween.

The second transistor M2 may be connected between the data line DL and the first node N1. A gate electrode of the second transistor M2 is connected to the scan line SL. When a scan signal of a gate-on voltage (e.g., a high level voltage) is supplied from the scan line SL, the second transistor M2 is turned on to electrically connect the first node N1 to the data line DL.

For each frame period, the data signal of the corresponding frame is supplied to the data line DL. The data signal is transmitted through the second transistor M2, which is turned on during a period when the scan signal of the gate-on voltage is supplied, to the first node N1. In other words, the second transistor M2 may be a switching transistor configured to transmit each data signal into the pixel PXL.

One electrode of the storage capacitor Cst is connected to the first node N1, while the other electrode of the storage capacitor Cst is connected to the second electrode of the first transistor M1. Such a storage capacitor Cst charges to a voltage (or holds a charge) corresponding to the data signal supplied to the first node N1 during each frame period.

The third transistor M3 is connected between the first electrode ELT1 of the light emitting unit EMU (or the second electrode of the first transistor M1) and the sensing line SENL. A gate electrode of the third transistor M3 is connected to the sensing signal line SSL. Such a third transistor M3 may transmit a voltage value applied to the first electrode ELT1 of the light emitting unit EMU to the sensing signal SENL in response to the sensing signal supplied to the sensing signal line SSL during a sensing period (e.g., a set or predetermined sensing period). The voltage value transmitted through the sensing line SENL may be provided to an external circuit (e.g. a timing controller), and the external circuit may extract the characteristic information (e.g. the threshold voltage of the first transistor M1) of each pixel PXL based on the provided voltage value. The extracted characteristic information may be used to convert image data so that characteristic deviations between the pixels PXL are compensated.

Although in FIGS. 3A-3C the transistors, e.g., the first, second, and third transistors M1, M2, and M3, included in the pixel circuit PXC have been illustrated as being formed of N-type transistors, the present disclosure is not limited to this. In other words, at least one of the first, second, and third transistors M1, M2, and M3 may be changed to a P-type transistor.

Furthermore, the structure and driving method of the pixel PXL may be changed in various ways. For example, the pixel circuit PXC may be formed of a pixel circuit which may have various structures and/or be operated in various driving manners, in addition to the embodiments corresponding to FIGS. 3A-3C.

For example, in some embodiments, the pixel circuit PXC may not include the third transistor M3. Furthermore, the pixel circuit PXC may further include other circuit elements, such as a compensation transistor for compensating for the threshold voltage of the first transistor M1, an initialization transistor for initializing the voltage of the first node N1 or the first electrode ELT1 of the light emitting unit EMU, an emission control transistor for controlling a period when driving current is supplied to the light emitting unit EMU, and/or a boosting capacitor for boosting the voltage of the first node N1.

In some embodiments, when the pixel PXL is a pixel of a passive light emitting display device, the pixel circuit PXC may be omitted. In such a case, the light emitting unit EMU may be directly connected to the scan line SL, the data line DL, a first power line PL1, a second power line PL2, and/or other signal lines or power lines.

The light emitting unit EMU may include at least one light emitting element LD, e.g. a plurality of light emitting elements LD, connected between the first power supply VDD and the second power supply VSS.

For example, the light emitting unit EMU may include the first electrode ELT1 (also referred to as a "first pixel electrode" or a "first alignment electrode") connected to the first power supply VDD via the pixel circuit PXC and the first power line PL1, the second electrode ELT2 (also referred to as a "second pixel electrode" or a "second alignment electrode") connected to the second power supply VSS via the second power line PL2, and the plurality of light emitting elements LD connected between the first and second electrodes ELT1 and ELT2.

The first and second power supplies VDD and VSS may have different potentials to allow the light emitting elements LD to emit light. For example, the first power supply VDD may be set as a high-potential power supply, and the second power supply VSS may be set as a low-potential power supply.

In some embodiments, the light emitting unit EMU may include a plurality of light emitting elements LD that are connected in parallel in the same direction between the first electrode ELT1 and the second electrode ELT2, as in the embodiments corresponding to FIG. 3A. For example, each light emitting element LD may include a first end EP1 (e.g. a P-type end) connected to the first power supply VDD through the first electrode ELT1 and/or the pixel circuit PXC and the first power line PL1, and a second end EP2 (e.g. an N-type end) connected to the second power supply VSS through the second electrode ELT2 and the second power line PL2. In other words, the light emitting elements LD may be connected in parallel in a forward direction between the first and second electrodes ELT1 and ELT2.

Each light emitting element LD connected in the forward direction between the first power supply VDD and the second power supply VSS may form a valid light source. Furthermore, the valid light sources may be collected to form the light emitting unit EMU of the pixel PXL.

The first ends EP1 of the light emitting elements LD may be connected in common, or commonly connected, to the pixel circuit PXC through one electrode (e.g. the first electrode ELT1) of the light emitting unit EMU, and may be connected to the first power supply VDD through the pixel circuit PXC and the power line PL1. The second ends EP2 of the light emitting elements LD may be connected in common, or commonly connected, to the second power supply VSS through another electrode (e.g. the second electrode ELT2) of the light emitting unit EMU and the second power line PL2.

Although, FIG. 3A illustrates the pixel PXL includes the light emitting unit EMU having a parallel structure, the present disclosure is not limited thereto. For example, the pixel PXL may include a light emitting unit EMU having a series structure or a series-parallel structure. In such a case, the light emitting unit EMU may include light emitting elements LD connected in a series structure or a series-parallel structure between the first power supply VDD and the second power supply VSS. For example, the light emitting unit EMU may include a plurality of light emitting elements LD that are separately connected to two serial ports, as in the embodiments corresponding to FIG. 3B.

Referring to FIG. 3B, the light emitting unit EMU may include a first serial port including the first and second electrodes ELT1 and ELT2 and at least one light emitting element LD1 connected in the forward direction between the first and second electrodes ELT1 and ELT2, and a second serial port including a third and a fourth electrodes ELT3 and ELT4 and at least one light emitting element LD2 connected in the forward direction between the third and fourth electrodes ELT3 and ELT4.

The first electrode of the light emitting unit EMU, e.g. the first electrode ELT1 may be a first pixel electrode (or an anode electrode) of the light emitting unit EMU. The last electrode of the light emitting unit EMU, e.g. the fourth electrode ELT4 may be a second pixel electrode (or a cathode electrode) of the light emitting unit EMU. The remaining electrodes of the light emitting unit EMU, e.g. the second and third electrodes ELT2 and ELT3 may be integrally or non-integrally connected to each other to form a first intermediate electrode IET1. In this case, the second and third electrodes ELT2 and ELT3 may be integrated to be regarded as one first intermediate electrode IET1.

The number of serial ports forming each light emitting unit EMU may be variously changed according to different embodiments. For example, the light emitting unit EMU may include a plurality of light emitting elements LD that are separately connected to four serial ports, as in the embodiments corresponding to FIG. 3C.

Referring to FIG. 3C, the light emitting unit EMU may include a first serial port including the first and second electrodes ELT1 and ELT2 and at least one light emitting element LD1 connected in the forward direction between the first and second electrodes ELT1 and ELT2, a second serial port including the third and fourth electrodes ELT3 and ELT4 and at least one light emitting element LD2 connected in the forward direction between the third and fourth electrodes ELT3 and ELT4, a third serial port including the fifth and sixth electrodes ELT5 and ELT6 and at least one light emitting element LD3 connected in the forward direction between the fifth and sixth electrodes ELT5 and ELT6, and a fourth serial port including the seventh and eighth electrodes ELT7 and ELT8 and at least one light emitting element LD4 connected in the forward direction between the seventh and eighth electrodes ELT7 and ELT8. In other words, each serial port may include a pair of electrodes (e.g. two electrodes), and at least one light emitting element LD connected between the pair of electrodes. Here, the numbers of the light emitting elements LD forming the respective serial ports may be the same as or different from each other, and the number of the light emitting elements LD is not particularly limited.

For the convenience of description, the light emitting elements LD of the first serial port, the second serial port, the third serial port, and the fourth serial port will be referred to as a "first light emitting element LD1", a "second light emitting element LD2", a "third light emitting element LD3", and a "fourth light emitting element LD4", respectively. Furthermore, when arbitrarily referring to at least one of the first to fourth light emitting elements LD1 to LD4 or when collectively referring to the first to fourth light emitting elements LD1 to LD4, they will be referred to as "light emitting element(s)".

The first electrode of the light emitting unit EMU, e.g. the first electrode ELT1 may be a first pixel electrode (or an anode electrode) of the light emitting unit EMU. The last electrode of the light emitting unit EMU, e.g. the eighth electrode ELT8 may be a second pixel electrode (or a cathode electrode) of the light emitting unit EMU.

The remaining electrodes of the light emitting unit EMU, e.g. the second to seventh electrodes ELT2 to ELT7 may form each intermediate electrode. For example, the second electrode ELT2 and the third electrode ELT3 may be integrally or non-integrally connected to form a first intermediate electrode IET1. Likewise, the fourth electrode ELT4 and the fifth electrode ELT5 may be integrally or non-integrally connected to form a second intermediate electrode IET2, and the sixth electrode ELT6 and the seventh electrode ELT7 may be integrally or non-integrally connected to form a third intermediate electrode IET3. In this case, the second and third electrodes ELT2 and ELT3 may be integrated to be regarded as one first intermediate electrode IET1, the fourth and fifth electrodes ELT4 and ELT5 may be integrated to be regarded as one second intermediate electrode IET2, and the sixth and seventh electrodes ELT6 and ELT7 may be integrated to be regarded as one third intermediate electrode IET3.

When the light emitting unit (EMU) is formed using the light emitting elements LD of the same condition (e.g. the same size and/or number) as the valid light source, and the light emitting elements LD are connected in a series structure or in a series-parallel hybrid structure, power efficiency can be improved. For example, the light emitting unit EMU in which the light emitting elements LD are connected in series or in a series-parallel structure may express higher luminance with the same current, as compared with the light emitting unit in which the light emitting elements LD are connected only in parallel. Furthermore, the light emitting unit EMU in which the light emitting elements LD are connected in series or in a series-parallel structure may express the same luminance with lower driving current, as compared with the light emitting unit in which the light emitting elements LD are connected in parallel.

In the pixel PXL in which the light emitting elements LD are connected in the serial structure or in the series-parallel hybrid structure, even if a short-circuit defect occurs at some of the serial ports, a certain degree of luminance may be expressed through the light emitting elements LD in the remaining serial ports, and therefore, the possibility of dark spot defects of the pixel PXL may be reduced.

Although FIGS. 3A-3C illustrate embodiments in which the light emitting elements LD are connected in the parallel structure or in the series-parallel hybrid structure, the present disclosure is not limited thereto. For example, in some embodiments, the light emitting elements LD forming the light emitting unit EMU of each pixel PXL may be connected to each other only in series.

Each of the light emitting elements LD may include the first end EP1 (e.g. the P-type end) connected to the first power supply VDD via the first pixel electrode (e.g. the first electrode ELT1), the pixel circuit PXC, and/or the first power line PL1, and the second end EP2 (e.g. the N-type end) connected to the second power supply VSS via the second pixel electrode (e.g. the eighth electrode ELT8) and the second power line PL2. In other words, the light emitting elements LD may be connected in the forward direction between the first power supply VDD and the second power supply VSS. Each of the light emitting elements LD connected in the forward direction may form each valid light source. The valid light sources may be collected to form the light emitting unit EMU of the pixel PXL.

The light emitting elements LD may emit light having a luminance corresponding to driving current supplied thereto through the corresponding pixel circuit PXC. For example, during each frame period, the pixel circuit PXC may supply driving current corresponding to a gray scale value that is to be expressed in the corresponding frame data to the light emitting unit EMU. Thus, while the light emitting elements LD emit light having luminance corresponding to the driving current, the light emitting unit EMU may express the luminance corresponding to the driving current.

In some embodiments, the light emitting unit EMU may further include at least one invalid light source, as well as the light emitting elements LD that form the respective valid light sources. For example, at least one invalid light emitting element which is arranged in a reverse direction or at least one end of which is floated may be further connected to at least one serial port. The invalid light emitting element may maintain an inactive state even when a driving voltage (e.g., a set or predetermined driving voltage (e.g. a forward driving voltage)) is applied between the first and second pixel electrodes, and thus may substantially maintain a non-emission state.

Figure 4:
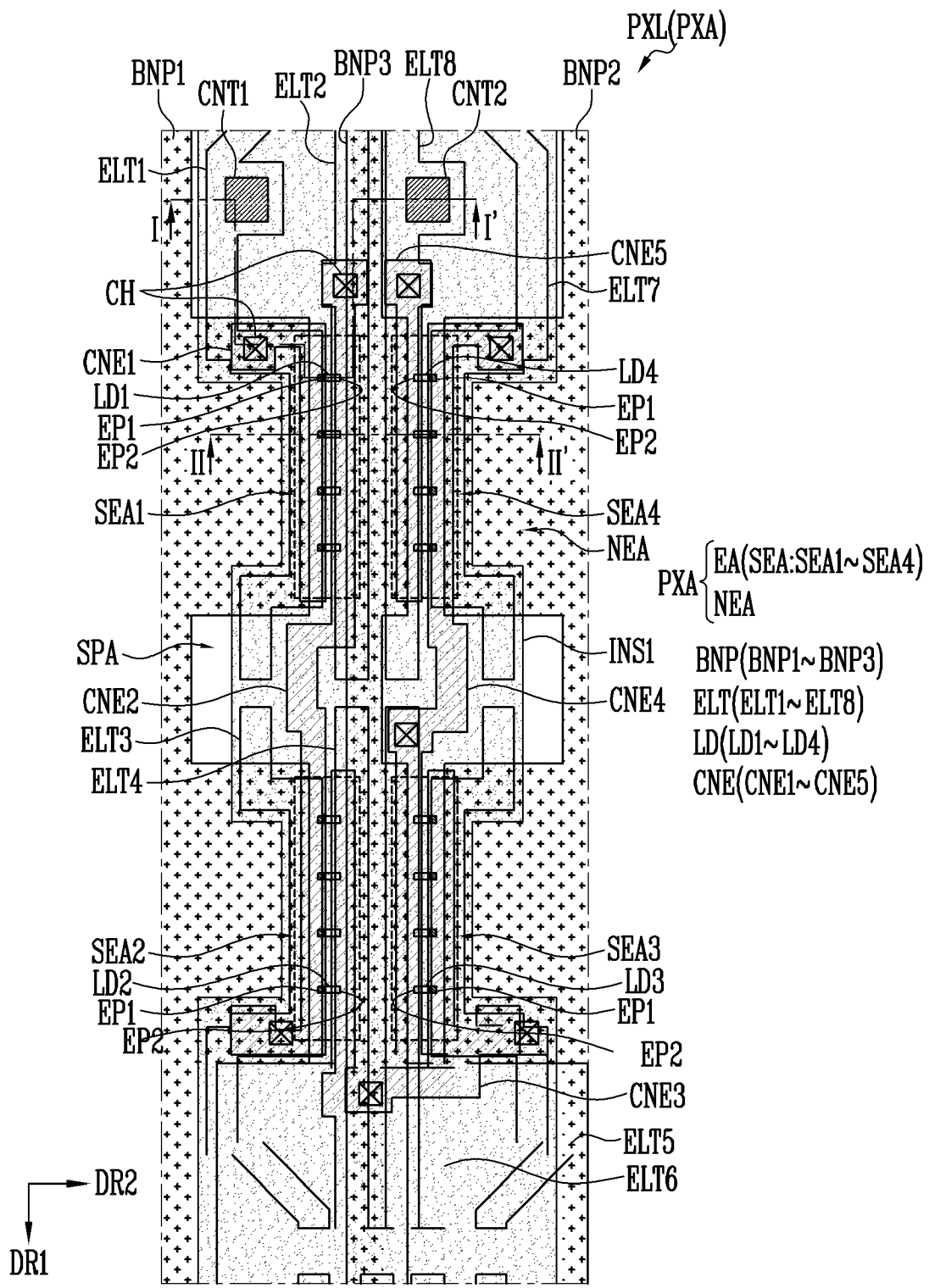
FIG. 4 is a plan view illustrating the pixel in accordance with some embodiments of the present disclosure.
Figure 5:
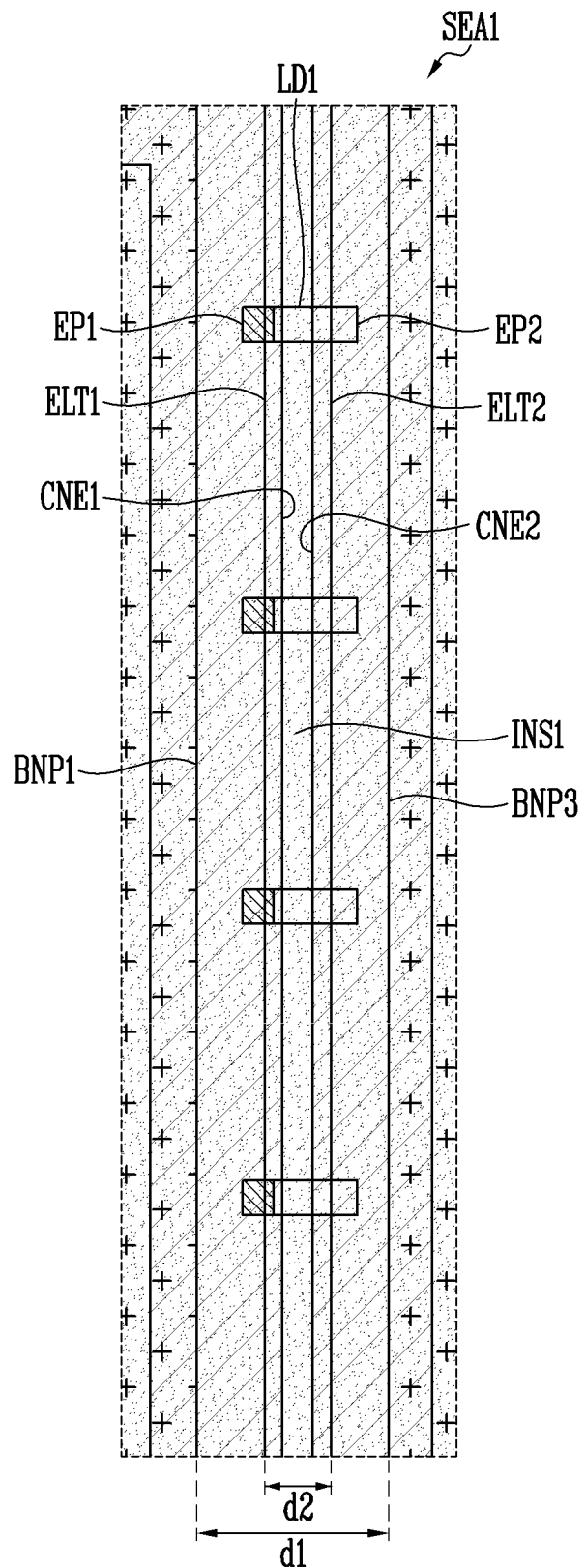
FIG. 5 is an enlarged view illustrating a first sub-emission area of FIG. 4.

FIG. 4 is a plan view illustrating a pixel PXL in accordance with some embodiments of the present disclosure. For example, FIG. 4 illustrates a pixel area PXA of the pixel PXL around the light emitting unit EMU of the pixel PXL including four serial ports, as in the embodiments corresponding to FIG. 3C. FIG. 5 is an enlarged view illustrating a first sub-emission area SEA1 of FIG. 4.

Referring to FIGS. 2-5, the pixel PXL may include a plurality of sub-emission areas corresponding to each serial port of the light emitting unit EMU. The sub-emission areas may be arranged in each pixel area PXA to be spaced from each other.

For example, the pixel PXL may include first to fourth sub-emission areas SEA1, SEA2, SEA3, and SEA4 corresponding to the first to fourth serial ports of the light emitting unit EMU. When the light emitting unit EMU of the pixel PXL includes only one serial port, one sub-emission area (or emission area EA) may be located in the pixel area PXA. Alternatively, even if the light emitting unit EMU of the pixel PXL includes only one serial port, a plurality of light emitting elements LD connected in parallel to the serial port may be separately located in two or more sub-emission areas.

The first to fourth sub-emission areas SEA1 to SEA4 may be located in the corresponding pixel area PXA to be spaced from each other, and may be arranged according to a certain rule. For example, the first to fourth sub-emission areas SEA1 to SEA4 may be arranged in a counterclockwise direction, but the present disclosure is not limited thereto.

Hereinafter, when arbitrarily referring to at least one of the first to fourth sub-emission areas SEA1 to SEA4 or when collectively referring to the first to fourth sub-emission areas SEA1 to SEA4, they will be referred to as "sub-emission area(s) SEA" or "first area(s)". In some embodiments, the sub-emission areas SEA located in each pixel area PXA may form the emission area EA of the corresponding pixel PXL.

In some embodiments, areas of the pixel area PXA other than the light emitting area EA may be a non-emission area NEA (also referred to as a "second area"). In some embodiments, the non-emission area NEA may be located around the sub-emission areas SEA to enclose each sub-emission area SEA. Furthermore, the non-emission area NEA may be located in a peripheral area of the corresponding pixel area PXA and/or between adjacent pixel areas PXA.

In other word, the pixel area PXA may include an emission area EA that includes light emitting elements LD to emit light, and a non-emission area NEA excluding the emission area EA. Furthermore, the emission area EA may include at least one sub-emission area SEA corresponding to at least one serial port.

Each sub-emission area SEA may include at least one pair of pixel electrodes ELT, and at least one light emitting element LD connected between the pixel electrodes ELT. For example, the first sub-emission area SEA1 may include a first electrode ELT1, a second electrode ELT2, and at least one first light emitting element LD1 connected between the first and second electrodes ELT1 and ELT2, and the second sub-emission area SEA2 may include a third electrode ELT3, a fourth electrode ELT4, and at least one second light emitting element LD2 connected between the third and fourth electrodes ELT3 and ELT4. Likewise, the third sub-emission area SEA3 may include a fifth electrode ELT5, a sixth electrode ELT6, and at least one third light emitting element LD3 connected between the fifth and sixth electrodes ELT5 and ELT6, and the fourth sub-emission area SEA4 may include a seventh electrode ELT7, an eighth electrode ELT8, and at least one fourth light emitting element LD4 connected between the seventh and eighth electrodes ELT7 and ELT8.

Furthermore, each sub-emission area SEA may further include contact electrodes CNE which are stably connected to the light emitting elements LD adjacent to each pixel electrode ELT and/or are used to connect two consecutive serial ports. In describing the example embodiments of the present disclosure, the first to eighth electrodes ELT1 to ELT8 are defined as pixel electrodes, and the contact electrodes CNE will be described as elements separate from the pixel electrodes. However, the present disclosure is not limited thereto. For example, the first to eighth electrodes ELT1 to ELT8 and the contact electrodes CNE will be collectively regarded as the pixel electrodes.

In some embodiments, the first, second, third, and/or fourth sub-emission areas SEA1, SEA2, SEA3, and SEA4 may substantially have similar or identical structure, but the present disclosure is not limited thereto. Furthermore, the numbers of the light emitting elements LD located in the first, second, third, and/or fourth sub-emission areas SEA1, SEA2, SEA3, and SEA4 or the shapes of the pixel electrodes ELT and the contact electrodes CNE may be the same as or different from each other.

The structure of the pixel PXL will be overall described, where the pixel PXL may include a plurality of pixel electrodes ELT formed in the corresponding pixel area PXA, bank patterns BNP located under the pixel electrodes ELT to partially overlap the pixel electrodes ELT, a first insulating layer INS1 located above the pixel electrodes ELT to cover the pixel electrodes ELT, and light emitting elements LD arranged between the adjacent pixel electrodes ELT in each sub-emission area SEA. Furthermore, the pixel PXL may further include contact electrodes CNE for connecting the light emitting elements LD to the pixel electrodes ELT.

In some embodiments, the bank patterns BNP, the pixel electrodes ELT, the first insulating layer INS1, the light emitting elements LD, and the contact electrodes CNE may be successively arranged with respect to a surface of the base layer BSL in which the pixel PXL is formed. The sectional structure of the pixel PXL will be described in detail later herein.

The bank patterns BNP may be formed such that each bank pattern extends in the first direction DR1 in the pixel area PXA and extends from each sub-emission area SEA (and/or the emission area EA) to the non-emission area NEA. Furthermore, the bank patterns BNP may be formed integrally or non-integrally with the bank patterns BNP of an adjacent pixel PXL in the first direction DR1 and/or the second direction DR2 crossing the first direction DR1. In some embodiments, the first direction DR1 may be a longitudinal direction (e.g. column or vertical direction), and the second direction DR2 may be a transverse direction (e.g. row or horizontal direction). But, the present disclosure is not limited thereto.

The bank patterns BNP may include a first bank pattern BNP1 and a second bank pattern BNP2 which are located in both edge portions of the pixel area PXA opposite to each other. For example, the bank patterns BNP may include the first bank pattern BNP1 located in a first edge portion (e.g. left area) of the pixel area PXA, and the second bank pattern BNP2 located in a second edge portion (e.g. right area) of the pixel area PXA. Furthermore, when the pixel PXL includes at least three pixel electrodes ELT arranged along the second direction DR2, the bank patterns BNP may further include a third bank pattern BNP3 located between the first and second bank patterns BNP1 and BNP2.

The first bank pattern BNP1 may extend from the first edge portion of the pixel area PXA to the inside of at least one sub-emission area SEA adjacent thereto, and thereby may overlap at least one pixel electrode ELT located in at least one sub-emission area SEA. For example, the first bank pattern BNP1 may extend from the left edge portion of the pixel area PXA to the first and second sub-emission areas SEA1 and SEA2, and may partially overlap the first and third electrodes ELT1 and ELT3 in the first and second sub-emission areas SEA1 and SEA2 and a peripheral portion thereof. Thus, while the first and third electrodes ELT1 and ELT3 protrude upwards from the pixel PXL in an area where they overlap the first bank pattern BNP1, a reflective partition wall may be formed around the first ends EP1 of the first and second light emitting elements LD1 and LD2.

The second bank pattern BNP2 may extend from the second edge portion of the pixel area PXA to the interior of at least one sub-emission area SEA adjacent thereto, and thereby may overlap at least one pixel electrode ELT located in at least one sub-emission area SEA. For example, the second bank pattern BNP2 may extend from the right edge portion of the pixel area PXA to the third and fourth sub-emission areas SEA3 and SEA4, and may partially overlap the fifth and seventh electrodes ELT5 and ELT7 in the third and fourth sub-emission areas SEA3 and SEA4 and a peripheral area thereof. Thus, while the fifth and seventh electrodes ELT5 and ELT7 protrude upwards from the pixel PXL in an area where they overlap the second bank pattern BNP2, a reflective partition wall may be formed around the first ends EP1 of the third and fourth light emitting elements LD3 and LD4.

The third bank pattern BNP3 may be located between the first and second bank patterns BNP1 and BNP2 to be spaced from the first and second bank patterns BNP1 and BNP2, and may extend into at least one sub-emission area SEA. Thus, the third bank pattern BNP3 may overlap at least one pixel electrode ELT located in the at least one sub-emission area SEA. For example, the third bank pattern BNP3 may extend from the non-emission area NEA at the center of the pixel area PXA to each sub-emission area SEA to overlap the second, fourth, sixth, and eighth electrodes ELT2, ELT4, ELT6, and ELT8. Thus, while the second, fourth, sixth, and eighth electrodes ELT2, ELT4, ELT6, and ELT8 protrude upwards from the pixel PXL in an area where they overlap the third bank pattern BNP3, a reflective partition wall may be formed around the second ends EP2 of the first to fourth light emitting elements LD1 to LD4.

When the bank patterns BNP form the reflective partition wall around the light emitting elements LD together with the pixel electrodes ELT thereon, light emitted from the light emitting elements LD may be guided upwards from the pixel PXL (e.g. a front direction of the display panel PNL including a viewing angle range (e.g., a set or predetermined viewing angle range)). Therefore, the light efficiency of the pixel PXL may be enhanced.

In some embodiments, the bank patterns BNP may be arranged at relatively narrow intervals to be located adjacent to the first and second ends EP1 and EP2 of the light emitting elements LD in each sub-emission area SEA (and/or the emission area EA). The bank patterns BNP may be arranged at relatively wide intervals in the non-emission area NEA. In such a case, the bank patterns BNP may have a width (also referred to as a "first width" or "width of a first range") expanded in the second direction DR2 in an area corresponding to each sub-emission area SEA, and a width (also referred to as a "second width" or "width of a second range") reduced in the second direction DR2 in an area corresponding to the non-emission area NEA.

For example, neighboring bank patterns BNP (e.g. first and third bank patterns BNP1 and BNP3 and second and third bank patterns BNP2 and BNP3) may be spaced from each other by a first distance d1 (e.g., see FIG. 5) in each sub-emission area SEA, and may be spaced from each other by a distance that is greater than the first distance d1 in the non-emission area NEA. In order for the pixel electrodes ELT to protrude upwards by the bank patterns BNP in each sub-emission area SEA, a pair of pixel electrodes ELT in each sub-emission area SEA may be spaced from each other by a second distance d2 (e.g., see FIG. 5) that is smaller than the first distance d1 between corresponding bank patterns BNP.

At least one valley may be formed in a central portion of the pixel area PXA by the bank patterns BNP. The valley may have a minimum width in each sub-emission area SEA. For example, the bank patterns BNP may form a valley having a minimum width between the pair of pixel electrodes ELT located in each sub-emission area SEA. Thus, the light emitting elements LD supplied to each pixel area PXA may flow into the inside of each sub-emission area SEA, for example, the inside of the valley having the minimum width, and may be arranged in the valley. Therefore, a greater number of light emitting elements LD may be arranged between a pair of adjacent pixel electrodes ELT in each sub-emission area SEA, so that the utilization rate of the light emitting elements LD supplied to each pixel area PXA may be increased.

In some embodiments, the bank patterns BNP may include a hydrophobic surface. For example, the bank patterns BNP themselves may be formed of hydrophobic patterns using a hydrophobic material, or a hydrophobic film made of a hydrophobic material may be formed on the bank patterns BNP, so that the bank patterns BNP may be formed to have the hydrophobic surface. For example, the bank patterns BNP may be formed using a hydrophobic organic insulating material having a large contact angle, such as polyacrylate, so that the bank patterns BNP may be formed of hydrophobic patterns.

The bank patterns BNP may be covered by a hydrophilic first insulating layer INS1 in each sub-emission area SEA and/or the non-emission area NEA therearound. For example, the bank patterns BNP may be covered by the hydrophilic first insulating layer INS1 in the central portion excluding the first and second edge portions on opposite sides of the pixel area PXA. The bank patterns BNP may not be covered by the first insulating layer INS1 in the remaining non-emission area NEA, e.g. the first and second edge portions of the pixel area PXA. Thus, when the light emitting elements LD are supplied to each pixel area PXA through an inkjet method, a solution containing the light emitting elements LD (hereinafter, referred to as "light-emitting-element ink") may be controlled to flow into the central portion of the pixel area PXA. Thereby, the light emitting elements LD may be smoothly supplied to each sub-emission area SEA.

The pixel electrodes ELT may include at least one pair of electrodes located in each sub-emission area SEA. For example, the pixel electrodes ELT may include first and second electrodes ELT1 and ELT2 located in the first sub-emission area SEA1 opposite to each other, third and fourth electrodes ELT3 and ELT4 located in the second sub-emission area SEA2 opposite to each other, fifth and sixth electrodes ELT5 and ELT6 located in the third sub-emission area SEA3 opposite to each other, and seventh and eighth electrodes ELT7 and ELT8 located in the fourth sub-emission area SEA4 opposite to each other.

In each sub-emission area SEA, the first and eighth electrodes ELT1 and ELT8 may extend in the first direction DR1, and may be located to be spaced from each other in the second direction DR2. However, the present disclosure is not limited thereto. Furthermore, in each pixel area PXA, the first and eighth electrodes ELT1 and ELT8 may have a uniform width or a non-uniform width, and may or may not include a bent portion. In other words, the shape and/or arrangement structure of the first and eighth electrodes ELT1 and ELT8 may be variously changed according to various embodiments.

Some of the first to eighth electrodes ELT1 to ELT8 may be formed of one alignment line, and then may be cut in a portion (e.g. an upper or lower portion of each pixel area PXA) between the electrode and an adjacent pixel PXL and/or a separating portion (e.g. a portion SPA of FIG. 4) between neighboring sub-emission areas SEA in each pixel area PXA to be separated into each pixel electrode ELT. Thus, each pixel electrode ELT may be formed as an individual electrode corresponding to each serial port, while reducing the number of alignment signals for aligning the light emitting elements LD in each pixel area PXA.

The pair of pixel electrodes ELT constituting each serial port may be located to be close to each other in areas where the light emitting elements LD are arranged (or are to be arranged), e.g. each sub-emission area SEA, and may be located to be relatively far from each other in the other areas. For example, the pair of pixel electrodes ELT may be opposite to each other at a second distance d2 in each sub-emission area SEA, and may be opposite to each other at a distance that is greater than the second distance d2 in the non-emission area NEA.

Thus, in a step of supplying and aligning the light emitting elements LD in each pixel area PXA, the light emitting elements LD may be arranged in a desired area. For example, when an alignment signal (e.g., a set or predetermined alignment signal) is applied to the pixel electrodes ELT (or alignment lines before being separated into the pixel electrodes ELT) to align the light emitting elements LD in each pixel area PXA, a stronger electric field is generated in the sub-emission areas SEA where the distance between the pixel electrodes ELT is close, and the light emitting elements LD may be arranged in the sub-emission areas SEA.

Any one of the pixel electrodes ELT, e.g. the first electrode ELT1 may be connected to the pixel circuit PXC and/or the first power line PL1 through a first contact portion CNT1. Another one of the pixel electrodes ELT, e.g. the eighth electrode ELT8 may be connected to the second power line PL2 through a second contact portion CNT2.

In some embodiments, the pixel electrodes ELT may be in direct contact with and connected to the light emitting elements LD of each serial port, or may be connected to the light emitting elements LD through a separate contact electrode CNE. For example, the pixel electrodes ELT may be connected to the first or second ends EP1 or EP2 of adjacent light emitting elements LD through each contact electrode CNE.

The first insulating layer INS1 is located in a portion of the pixel area PXA to cover the pixel electrodes ELT. For example, the first insulating layer INS1 may be located in a portion of the pixel area PXA including the sub-emission areas SEA to completely cover the pixel electrodes ELT in each sub-emission area SEA. In some embodiments, the first insulating layer INS1 may be removed to expose the bank patterns BNP in other portions of the pixel area PXA including edge portions on opposite sides of the pixel area PXA.

For example, the first insulating layer INS1 may be located in the central portion of the pixel area PXA including the sub-emission areas SEA, and may not be located in the first and second edge portions (e.g. left/right edge portions) on the opposite sides of the pixel area PXA. In such a case, the first insulating layer INS1 may extend in the first direction DR1 in each pixel area PXA, and may overlap the bank patterns BNP in the central portion of the pixel area PXA.

In some embodiments, the first insulating layer INS1 may be removed in the first and second edge portions of the pixel area PXA. Thus, in the first and second edge portions, a portion of the bank patterns BNP, for example, the first and second bank patterns BNP1 and BNP2 may not be covered by the first insulating layer INS1, but may be exposed.

The first insulating layer INS1 may be formed above the pixel electrodes ELT to cover the pixel electrodes ELT, and may have a shape and a position corresponding to those of the pixel electrodes ELT. Furthermore, the first insulating layer INS1 may be formed to correspond to areas where the light emitting elements LD are to be arranged, and may have a shape and a position corresponding to those of the sub-emission areas SEA.

For example, the first insulating layer INS1 may be formed to have a minimum width with a margin sufficient to cover the pixel electrodes ELT, and may have a non-uniform width within the pixel area PXA according to the position, shape, and/or spacing of the pixel electrodes ELT. For example, the first insulating layer INS1 may be formed to have a minimum width with a margin sufficient to cover the pixel electrodes ELT in an area (e.g. an area corresponding to the sub-emission areas SEA) having a small spacing between the pixel electrodes ELT. Furthermore, the first insulating layer INS1 may have a greater width as a distance between the pixel electrodes ELT is increased in an area corresponding to the non-emission area NEA.

In some embodiments, the first insulating layer INS1 may include a hydrophilic surface. For example, the first insulating layer INS1 itself may be formed in a hydrophilic pattern using the hydrophilic material, or a hydrophilic material may be coated on the surface of the first insulating layer INS1, so that the first insulating layer INS1 may be formed to have the hydrophilic surface. For example, the first insulating layer INS1 may be formed using a hydrophilic inorganic insulating material with a small contact angle such as silicon nitride (SiNx) or silicon oxide (SiOx), and thereby the first insulating layer INS1 may be formed of a hydrophilic layer.

When the first insulating layer INS1 has hydrophilic properties, the supply and arrangement position of the light emitting elements LD may be easily controlled by adjusting a position where the first insulating layer INS1 is formed. For example, when the light emitting elements LD are supplied to each pixel area PXA through the inkjet method, the first insulating layer INS1 having hydrophilic properties may be formed only in an area where the light emitting elements LD are to be arranged, e.g. the central portion of the pixel area PXA including the sub-emission areas SEA. In the first and second edge portions of the pixel area PXA belonging to the non-emission area NEA, the first and second bank patterns BNP1 and BNP2 having hydrophobic properties may be exposed. In this case, while the light-emitting-element ink is intensively supplied to the central portion of the pixel area PXA, the light emitting elements LD may be controlled to be smoothly supplied and aligned in each sub-emission area SEA. Furthermore, as the supply and arrangement position of the light emitting elements LD may be controlled only with the bank patterns BNP and the first insulating layer INS1, in some embodiments, to form a separate dam structure for controlling the supply area of the light-emitting-element ink may not be needed.

The light emitting elements LD may be separately arranged in each sub-emission area SEA on the first insulating layer INS1. The light emitting elements LD may be connected between the pixel electrodes ELT located in each sub-emission area SEA.

For example, the light emitting elements LD may include first to fourth light emitting elements LD1 to LD4 which are separately arranged in the first to fourth sub-emission areas SEA1 to SEA4 on the first insulating layer INS1. The first to fourth light emitting elements LD1 to LD4 may be connected between the first and second electrodes ELT1 and ELT2, between the third and fourth electrodes ELT3 and ELT4, between the fifth and sixth electrodes ELT5 and ELT6, and between the seventh and eighth electrodes ELT7 and ELT8, respectively.

In some embodiments, the light emitting elements LD may be connected to each pixel electrode ELT by each contact electrode CNE. Furthermore, the light emitting elements LD located at two consecutive serial ports may be connected in series to each other by at least one contact electrode CNE.

For example, the pixel PXL may include contact electrodes CNE which are located on each pixel electrode ELT and connect the first or second end EP1 or EP2 of at least one light emitting element LD adjacent to the pixel electrode ELT to the pixel electrode ELT. For example, the pixel PXL may include first to fifth contact electrodes CNE1 to CNE5.

The first contact electrode CNE1 may be located on the first ends EP1 of the first light emitting elements LD1 and the first electrode ELT1. The first contact electrode CNE1 may connect the first ends EP1 of the first light emitting elements LD1 to the first electrode ELT1.

The second contact electrode CNE2 may be located on the second ends EP2 of the first light emitting elements LD1 and the second electrode ELT2 to connect the second ends EP2 of the first light emitting elements LD1 to the second electrode ELT2. Furthermore, the second contact electrode CNE2 may be located on the first ends EP1 of the second light emitting elements LD2 and the third electrode ELT3 to connect the first ends EP1 of the second light emitting elements LD2 to the third electrode ELT3.

To this end, the second contact electrode CNE2 may extend from the first sub-emission area SEA1 through the non-emission area NEA between the first and second sub-emission areas SEA1 and SEA2 (e.g. the separating portion SPA of the pixel electrodes ELT) to the second sub-emission area SEA2 to connect the second electrode ELT2 to the third electrode ELT3. In some embodiments, the second contact electrode CNE2 may be composed of a plurality of separate electrodes located in the first and second sub-emission areas SEA1 and SEA2, respectively, and the separate electrodes may be connected to each other through a bridge pattern or the like. The first and second serial ports may be connected to each other by the second contact electrode CNE2.

The third contact electrode CNE3 may be located on the second ends EP2 of the second light emitting elements LD2 and the fourth electrode ELT4 to connect the second ends EP2 of the second light emitting elements LD2 to the fourth electrode ELT4. Furthermore, the third contact electrode CNE3 may be located on the first ends EP1 of the third light emitting elements LD3 and the fifth electrode ELT5 to connect the first ends EP1 of the third light emitting elements LD3 to the fifth electrode ELT5.

To this end, the third contact electrode CNE3 may extend from the second sub-emission area SEA2 through the non-emission area NEA between the second and third sub-emission areas SEA2 and SEA3 to the third sub-emission area SEA3 to connect the fourth electrode ELT4 to the fifth electrode ELT5. In some embodiments, the third contact electrode CNE3 may be composed of a plurality of separate electrodes located in the second and third sub-emission areas SEA2 and SEA3, respectively, and the separate electrodes may be connected to each other through a bridge pattern or the like. The second and third serial ports may be connected to each other by the third contact electrode CNE3.

The fourth contact electrode CNE4 may be located on the second ends EP2 of the third light emitting elements LD3 and the sixth electrode ELT6 to connect the second ends EP2 of the third light emitting elements LD3 to the sixth electrode ELT6. Furthermore, the fourth contact electrode CNE4 may be located on the first ends EP1 of the fourth light emitting elements LD4 and the seventh electrode ELT7 to connect the first ends EP1 of the fourth light emitting elements LD4 to the seventh electrode ELT7.

To this end, the fourth contact electrode CNE4 may extend from the third sub-emission area SEA3 through the non-emission area NEA between the third and fourth sub-emission areas SEA3 and SEA4 to the fourth sub-emission area SEA4 to connect the sixth electrode ELT6 to the seventh electrode ELT7. In some embodiments, the fourth contact electrode CNE4 may be composed of a plurality of separate electrodes located in the third and fourth sub-emission areas SEA3 and SEA4, respectively, and the separate electrodes may be connected to each other through a bridge pattern or the like. The third and fourth serial ports may be connected to each other by the fourth contact electrode CNE4.

The fifth contact electrode CNE5 may be located on the second ends EP2 of the fourth light emitting elements LD4 and the eighth electrode ELT8. The fifth contact electrode CNE5 may connect the second ends EP2 of the fourth light emitting elements LD4 to the eighth electrode ELT8.

In this way, the pixel electrodes ELT and the light emitting elements LD may be connected in a desired shape using the contact electrodes CNE. For example, the first light emitting elements LD1, the second light emitting elements LD2, the third light emitting elements LD3, and the fourth light emitting elements LD4 may be successively connected in series using the contact electrodes CNE.

Furthermore, in order to increase the utilization rate of the light emitting elements LD supplied to each sub-emission area SEA, the light emitting elements LD may be deflected and aligned so that a greater number (or ratio) of the light-emitting elements LD are aligned in a specific direction in each sub-emission area SEA, by adjusting an alignment signal for aligning the light emitting elements LD or forming a magnetic field. In this case, the pixel electrodes ELT may be connected depending on the arrangement direction of a greater number of light emitting elements LD, using the contact electrodes CNE. Thus, the utilization rate of the light emitting elements LD may be improved, and the light efficiency of the pixel PXL may be improved.

In some embodiments, each contact electrode CNE may be directly formed on the first or second ends EP1 or EP2 of the adjacent light emitting elements LD to be connected to the first or second ends EP1 or EP2 of the light emitting elements LD.

In some embodiments, the first insulating layer INS1 may be located between each contact electrode CNE and the pixel electrode(s) ELT corresponding thereto, and each contact electrode CNE and the pixel electrode(s) ELT corresponding thereto may be connected to each other through each contact hole CH formed in the first insulating layer INS1. In this case, the pixel electrodes ELT may be stably covered by the first insulating layer INS1, thus preventing the pixel electrodes ELT from being damaged in a subsequent process (e.g., during a manufacturing process).

In some embodiments, the pixel electrodes ELT and the contact electrodes CNE may be connected through each contact hole CH outside the corresponding sub-emission areas SEA (i.e. in the non-emission area NEA). In this case, because a process for forming the contact hole CH in the first insulating layer INS1 may be performed at least in areas other than the area where the light emitting elements LD are arranged, it is possible to prevent damage to the light emitting elements.

In the above-described embodiments of the present disclosure, in order to improve the light efficiency of each pixel PXL, the bank patterns BNP forming the reflective partition wall in the emission area EA may be formed to extend to the non-emission area NEA outside the emission area EA, for example, opposite edge portions of the pixel area PXA (i.e. the first and second edge portions). Furthermore, the first insulating layer INS1 may be formed to cover the pixel electrodes ELT, and the first insulating layer INS1 may be removed from the opposite edge portions of the pixel area PXA to expose the bank patterns BNP. Thus, the supply and arrangement position of the light emitting elements LD can be easily controlled without a separate dam structure.

According to some embodiments of the present disclosure, the dam structure may be omitted, so that the number of masks used in the process of manufacturing the pixel PXL may be reduced, and the height of a display layer on which the light emitting unit EMU of the pixel PXL is formed may be reduced or minimized. Thus, the manufacturing process of the pixel PXL may be simplified, and difficulty in a subsequent process due to a step caused by a separate dam structure may be solved. Furthermore, a cell gap of the display panel PNL (e.g. a gap between a lower plate on which the pixels PXL are formed and an upper plate on which color filters are formed) may be reduced. If the cell gap of the display panel PNL is reduced, the light emission efficiency of the pixels PXL may be improved, and the thickness of the display panel PNL may be reduced.

Figure 6A:
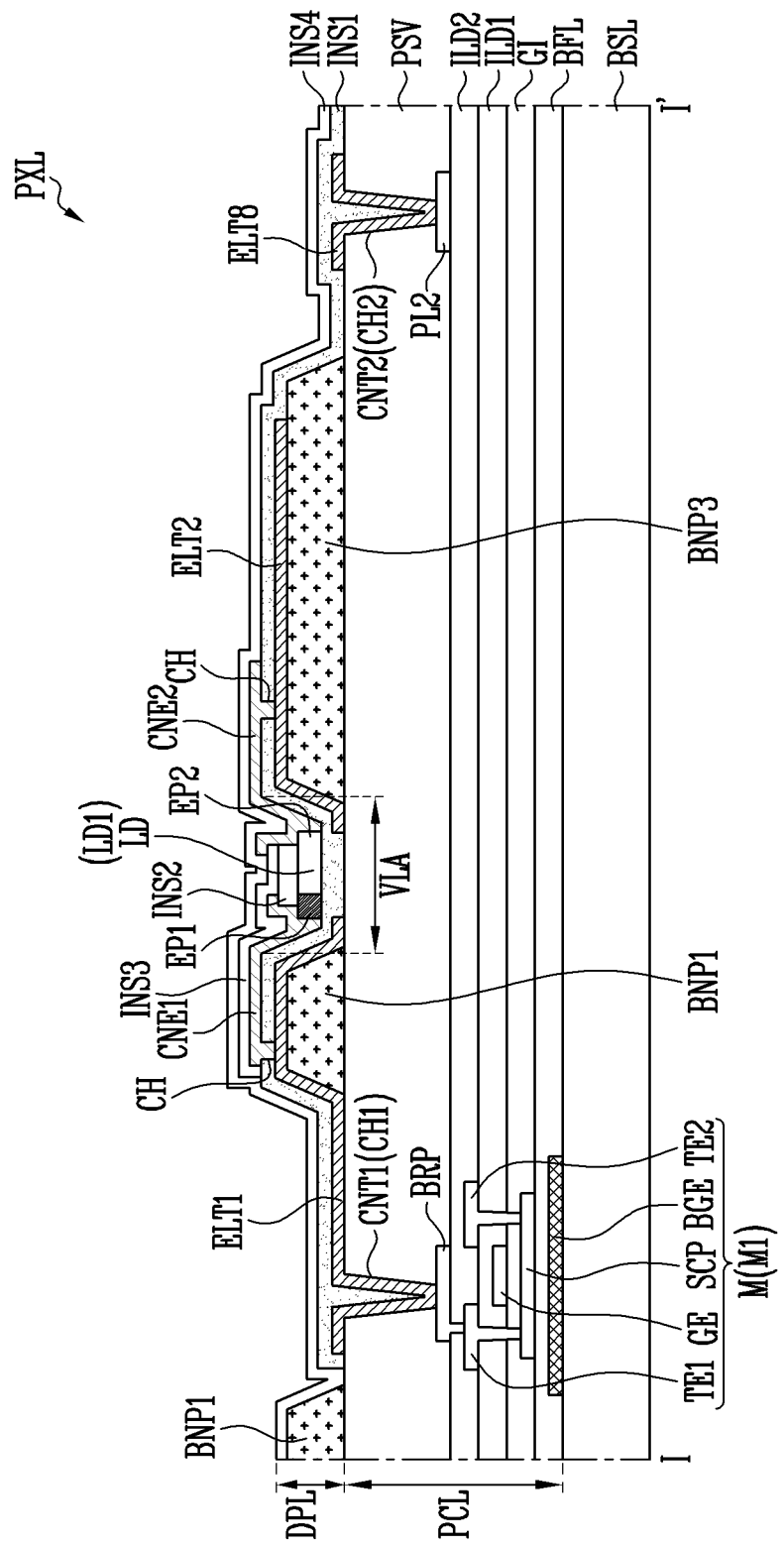
FIGS. 6A and 6B are sectional views respectively taken along the lines I-I' and II-II' of FIG. 4.
Figure 6B:
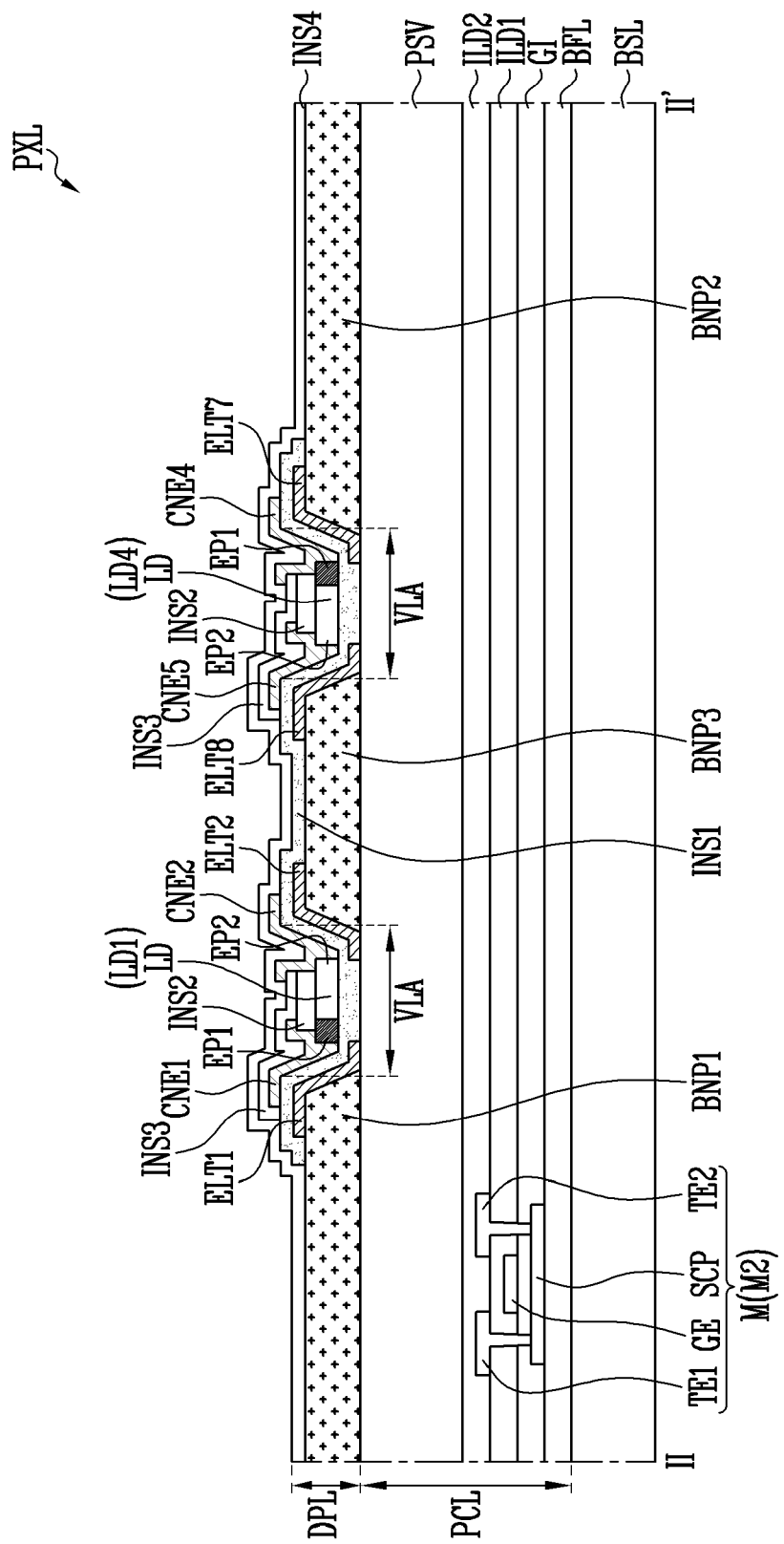

FIGS. 6A and 6B are sectional views respectively taken along the lines I-I' and II-II' of FIG. 4. In some embodiments, FIG. 6A illustrates the transistor M (e.g. the first transistor M1 of FIG. 3C) that is connected through the first contact portion CNT1 and the bridge pattern BRP to the first electrode ELT1, and that includes the back gate electrode BGE, as an example of the circuit elements which may be located in the circuit layer PCL, and illustrates the second power line PL2 connected through the second contact portion CNT2 to the eighth electrode ELT8, as an example of the line which may be located in the circuit layer PCL. FIG. 6B illustrates any other transistor M (e.g. the second transistor M2 of FIG. 3C) which does not include the back gate electrode BGE, as an example of the circuit elements which may be located in the circuit layer PCL.

Referring to FIGS. 2-6B, the pixel PXL and the display device having the pixel in accordance with some embodiments of the present disclosure may include a circuit layer PCL and a display layer DPL located on a surface of the base layer BSL to overlap each other. For example, the display area DA may include the circuit layer PCL located on a surface of the base layer BSL, and the display layer DPL located on the circuit layer PCL. The mutual position of the circuit layer PCL and the display layer DPL on the base layer BSL may vary according to various embodiments. In the case of separately disposing the circuit layer PCL and the display layer DPL in different layers, each layout space for forming the pixel circuit PXC and the light emitting unit EMU on a plane may be sufficiently secured.

The circuit elements (e.g. the transistors M and the storage capacitor Cst) forming the pixel circuit PXC of the corresponding pixel PXL and various lines connected thereto may be located in each pixel area PXA of the circuit layer PCL. The pixel electrodes ELT, the light emitting elements LD, and/or the contact electrodes CNE forming the light emitting unit EMU of the corresponding pixel PXL may be located in each pixel area PXA of the display layer DPL.

The circuit layer PCL may include a plurality of insulating layers as well as the circuit elements and the lines. For example, the circuit layer PCL may include a buffer layer BFL, a gate insulating layer GI, a first interlayer insulating layer ILD1, a second interlayer insulating layer ILD2, and/or a passivation layer PSV, which are successively stacked on a surface of the base layer BSL.

Furthermore, the circuit layer PCL may selectively include a first conductive layer which includes a back gate electrode BGE (or a shielding layer) located under at least some transistors M (e.g. the first transistor M1).

The buffer layer BFL may be located on a surface of the base layer BSL including the first conductive layer and on the back gate electrode BGE. The buffer layer BFL may prevent impurities from diffusing into each circuit element.

A semiconductor layer may be located on the buffer layer BFL. The semiconductor layer may include a semiconductor pattern SCP of each transistor M. The semiconductor pattern SCP may include a channel area overlapping the gate electrode GE, and first and second conductive areas (e.g. source and drain areas) located on opposite sides of the channel area.

A gate insulating layer GI may be located on the semiconductor layer. Furthermore, a second conductive layer may be located on the gate insulating layer GI.

The second conductive layer may include a gate electrode GE of each transistor M. The second conductive layer may further include a first electrode of the storage capacitor Cst and/or a line (e.g., a set or predetermined line).

The first interlayer insulating layer ILD1 may be located on the second conductive layer. Furthermore, the third conductive layer may be located on the first interlayer insulating layer ILD1.

The third conductive layer may include first and second transistor electrodes TE1 and TE2 of each transistor M. Here, the first and second transistor electrodes TE1 and TE2 may be source and drain electrodes SE and DE. The third conductive layer may further include a first electrode of the storage capacitor Cst and/or a line (e.g., a set or predetermined line).

The second interlayer insulating layer ILD2 may be located on the third conductive layer. Furthermore, the fourth conductive layer may be located on the second interlayer insulating layer ILD2.

The fourth conductive layer may include a bridge pattern BRP connecting the circuit layer PCL with the display layer DPL and/or a line (e.g., a set or predetermined line (e.g. a first power line PL1 and/or a second power line PL2)). The bridge pattern BRP may be connected to a first pixel electrode (e.g. first electrode ELT1) of each light emitting unit EMU, through the first contact hole CH1 formed in the first contact portion CNT1. The second power line PL2 may be connected to a last pixel electrode (e.g. eighth electrode ELT8) of each light emitting unit EMU, through the second contact hole CH2 formed in the second contact portion CNT2.

The passivation layer PSV may be located on the fourth conductive layer. In some embodiments, the passivation layer PSV may include at least an organic insulating layer, and may substantially planarize the surface of the circuit layer PCL. The display layer DPL may be located above the passivation layer PSV.

The display layer DPL may include the light emitting unit EMU of each pixel PXL. For example, the display layer DPL may include a plurality of pixel electrodes ELT (e.g. the first to eighth electrodes ELT1 to ELT8) located in the sub-emission areas SEA of each pixel PXL, a plurality of light emitting elements LD connected between the pixel electrodes ELT in series, in parallel, or in a series-parallel structure, and a plurality of contact electrodes CNE connecting the pixel electrodes ELT with the light emitting elements LD.

Furthermore, the display layer DPL may include the bank patterns BNP located under the pixel electrodes ELT, and the first insulating layer INS1 located above the pixel electrodes ELT. For example, the display layer DPL may include the bank patterns BNP located under a portion of the pixel electrodes ELT to cause a portion of each of the pixel electrodes ELT1 to protrude upwards, and the first insulating layer INS1 located above the pixel electrodes ELT to completely cover the pixel electrodes ELT. In some embodiments, the display layer DPL may further include at least one conductive layer and/or insulating layer.

For example, the display layer DPL may include the bank patterns BNP, the pixel electrodes ELT, the first insulating layer INS1, the light emitting elements LD, the second insulating layer INS2, the contact electrodes CNE, and the fourth insulating layer INS4, which are successively located and/or formed above the circuit layer PCL.

In some embodiments, as illustrated in FIGS. 6A and 6B, a pair of contact electrodes CNE (e.g. the first and second contact electrodes CNE1 and CNE2) opposite to each other with each light emitting element LD being interposed therebetween may be formed on different layers. In this case, the third insulating layer INS3 may be located between the pair of contact electrodes CNE. For example, the third insulating layer INS3 may be located to cover one of the pair of contact electrodes CNE. For example, the third insulating layer INS3 may cover the first contact electrode CNE1, and a first end of the third insulating layer INS3 may be interposed between the first contact electrode CNE1 and the second contact electrode CNE2. In some embodiments, the pair of contact electrodes CNE may be located at the same layer. In such a case, the third insulating layer INS3 may be omitted.

The bank patterns BNP may be located on a surface of the base layer BSL on which the circuit layer PCL is selectively formed. The bank patterns BNP may protrude in the height direction of the pixel PXL on the surface of the base layer BSL. Thus, a portion of the pixel electrode ELT located on each bank pattern BNP may protrude upwards.

The reflective partition wall may be formed around the light emitting elements LD, by the bank patterns BNP and the pixel electrodes ELT located thereon. For example, when the pixel electrodes ELT include at least a reflective electrode layer, light emitted through the first and second ends EP1 and EP2 of the light emitting elements LD may be reflected by the reflective electrode layer to emit light towards the top of each pixel PXL.

In some embodiments, the bank patterns BNP may be located at the same layer on the surface of the base layer BSL. In this case, the bank patterns BNP may be substantially concurrently formed (e.g., simultaneously formed) using one mask.

Furthermore, the bank patterns BNP may be located at the same height with respect to the surface of the base layer BSL. This makes it easier to perform a process for forming certain electrodes (e.g. the pixel electrodes ELT and/or the contact electrodes CNE) and insulating layers (e.g. the first, second, third, and/or fourth insulating layers INS1 to INS4) above the bank patterns BNP, and it may reduce the cell gap of the display panel PNL.

However, the present disclosure is not limited thereto. For example, in some embodiments, the bank patterns BNP may be formed at different heights for each area, or may be formed at different heights for each bank pattern BNP. In such a case, the bank patterns BNP may be formed using a plurality of masks, or the bank patterns BNP may be substantially concurrently formed (e.g., simultaneously formed) using a single halftone mask.

The bank patterns BNP may have various shapes. In some embodiments, the bank pattern BNP may be formed to have an inclined surface that is inclined at an angle (e.g., a set angle or a predetermined angle) with the base layer BSL, as illustrated in FIGS. 6A and 6B. In some embodiments, the bank patterns BNP may have curved or stepped side walls. For example, at least one bank pattern BNP may have a semi-circular or semi-elliptical cross-section. The electrodes and/or insulating layers located above the bank pattern BNP may have a shape corresponding to that of the bank pattern BNP.

The pixel electrodes ELT may be located above the bank patterns BNP. The pixel electrodes ELT may be located in each sub-emission area SEA to be spaced from each other.

In some embodiments, each pixel electrode ELT may have a separated pattern for each pixel PXL, or may have a pattern which is connected in common in the plurality of pixels PXL. For example, each of the first to eighth electrodes ELT1 to ELT8 may have an independent pattern in which both ends thereof are cut in an outer portion of the corresponding pixel area PXA and/or between adjacent pixel areas PXA. In some embodiments, at least one pixel electrode (e.g. the first electrode ELT1) may have the independent pattern which is cut in the outer portion of the corresponding pixel area PXA and/or between adjacent pixel areas PXA, and a first end of at least another pixel electrode (e.g. the eighth electrode ELT8) may extend in the first direction DR1 or the second direction DR2 to be integrally connected to a certain pixel electrode (e.g. the eighth electrode ELT8 of a neighboring pixel PXL) of another neighboring pixel PXL in the first direction DR1 or the second direction DR2.

Each pixel electrode ELT may include at least one conductive material to have conductivity. Furthermore, the pixel electrodes ELT may include the same conductive material or different conductive materials. Furthermore, each pixel electrode ELT may be formed of a single-layer or multi-layer structure.

The first insulating layer INS1 is located on a surface of the base layer BSL including the pixel electrodes ELT. In some embodiments, the first insulating layer INS1 may have contact holes CH to connect each pixel electrode ELT to each contact electrode CNE, as illustrated in FIG. 6A.

In some embodiments, the first insulating layer INS1 may be formed to cover the first and second electrodes ELT1 and ELT2 completely. After the light emitting elements LD are supplied and aligned on the first insulating layer INS1, the contact holes CH may be formed in the first insulating layer INS1. As the pixel electrodes ELT are formed and then are covered by the first insulating layer INS1, it is possible to prevent the pixel electrodes ELT from being damaged in the subsequent process.

The light emitting elements LD may be supplied and aligned in each emission area EA in which the first insulating layer INS1 or the like is formed (or each sub-emission area SEA). In some embodiments, as a plurality of light emitting elements LD is supplied to the emission area EA of each pixel PXL through an inkjet method, a slit coating method, or various other methods, and an alignment signal (e.g., a set or predetermined alignment signal (or alignment voltage)) is applied to each of the pixel electrodes ELT (or alignment lines before being separated by the pixel electrodes ELT), the light emitting elements LD may be aligned between the pixel electrodes ELT.

As described above, a portion in which the first insulating layer INS1 is formed (e.g. a central portion of the pixel area PXA including the sub-emission areas SEA) may exhibit hydrophilicity, whereas a portion in which the first insulating layer INS1 is not formed (e.g. non-emission areas NEA located in opposite edge portions of the pixel area PXA) may exhibit hydrophobicity by the exposed bank patterns BNP. Thus, the light emitting elements LD may be controlled to be supplied to the central portion of the pixel area PXA. For example, the light-emitting-element ink including the light emitting elements LD may flow into the central portion of the pixel area PXA by the surface characteristics controlled for each area depending on whether the first insulating layer INS1 is formed or not. Furthermore, as a valley area VLA is formed between the bank patterns BNP in each sub-emission area SEA, the light emitting elements LD may be more intensively supplied and arranged in the valley area VLA.

In some embodiments, at least some of the light emitting elements LD may be located in a horizontal direction or in an oblique direction between the pair of pixel electrodes ELT so that opposite ends (i.e. the first and second ends EP1 and EP2) in the longitudinal direction thereof overlap or do not overlap a pair of neighboring pixel electrodes ELT. Furthermore, the opposite ends of the light emitting elements LD may be connected to each pixel electrode ELT by each corresponding contact electrode CNE.

The second insulating layer INS2 may be located on a portion of the light emitting elements LD. The second insulating layer INS2 may be locally on a portion of each of the light emitting elements LD to expose the first and second ends EP1 and EP2 of each of the light emitting elements LD. In some embodiments, the second insulating layer INS2 may be omitted. In such a case, the first end of each of the contact electrodes CNE may be located directly on the upper surface of adjacent light emitting elements LD.

If the second insulating layer INS2 is formed on the light emitting elements LD after the alignment of the light emitting elements LD is completed, it is possible to prevent the light emitting elements LD from being dislodged from the alignment position.

The opposite ends of the light emitting elements LD which are not covered by the second insulating layer INS2, i.e. the first and second ends EP1 and EP2 may be covered by each contact electrode CNE, and may be connected to each pixel electrode ELT through the corresponding contact electrode CNE.

The third insulating layer INS3 may cover any one of the pair of contact electrodes CNE located on the first and second ends EP1 and EP2 of the light emitting elements LD. If the second and/or third insulating layers INS2 and INS3 are formed above the light emitting elements LD, electrical stability between the first and second ends EP1 and EP2 of the light emitting elements LD may be secured. For example, the pair of contact electrodes CNE which are adjacent to each other may be stably separated by the second and/or third insulating layers INS2 and INS3. Thus, the short-circuit defect occurring between the first and second ends EP1 and EP2 of the light emitting elements LD may be prevented. In some embodiments, when the pair of contact electrodes CNE are located at the same layer, the third insulating layer INS3 may be omitted.

The contact electrodes CNE may be located on the second and/or third insulating layers INS2 and INS3, and may be formed of various transparent conductive materials. For example, the contact electrodes CNE may include at least one of various conductive materials, e.g. ITO, IZO, ITZO, ZnO, AZO, GZO, ZTO, GTO and FTO, and may be substantially transparent or translucent to satisfy a transmittancy (e.g., a set or predetermined transmittancy). Thus, light emitted from the light emitting elements LD through each of the first and second ends EP1 and EP2 may pass through the contact electrodes CNE and may be emitted to the outside of the pixel PXL.

The fourth insulating layer INS4 may be located on the contact electrodes CNE and/or the third insulating layer INS3. For example, the fourth insulating layer INS4 may be completely formed on the display area DA to cover the tops of the bank patterns BNP, the pixel electrodes ELT, the first, second, and/or third, insulating layers INS1, INS2, INS3, the light emitting elements LD, and the contact electrodes CNE. The fourth insulating layer INS4 may include at least one inorganic layer and/or organic layer.

In some embodiments, the fourth insulating layer INS4 may include a thin encapsulation layer having a multi-layered structure. For example, the fourth insulating layer INS4 may be the thin encapsulation layer of the multi-layered structure including at least two inorganic insulating layers and at least one organic insulating layer interposed between the at least two inorganic insulating layers. The material and/or structure of the fourth insulating layer INS4 may be variously changed. In some embodiments, at least one overcoat layer, a filler, and/or an upper substrate may be further located above the fourth insulating layer INS4.

Figure 7:
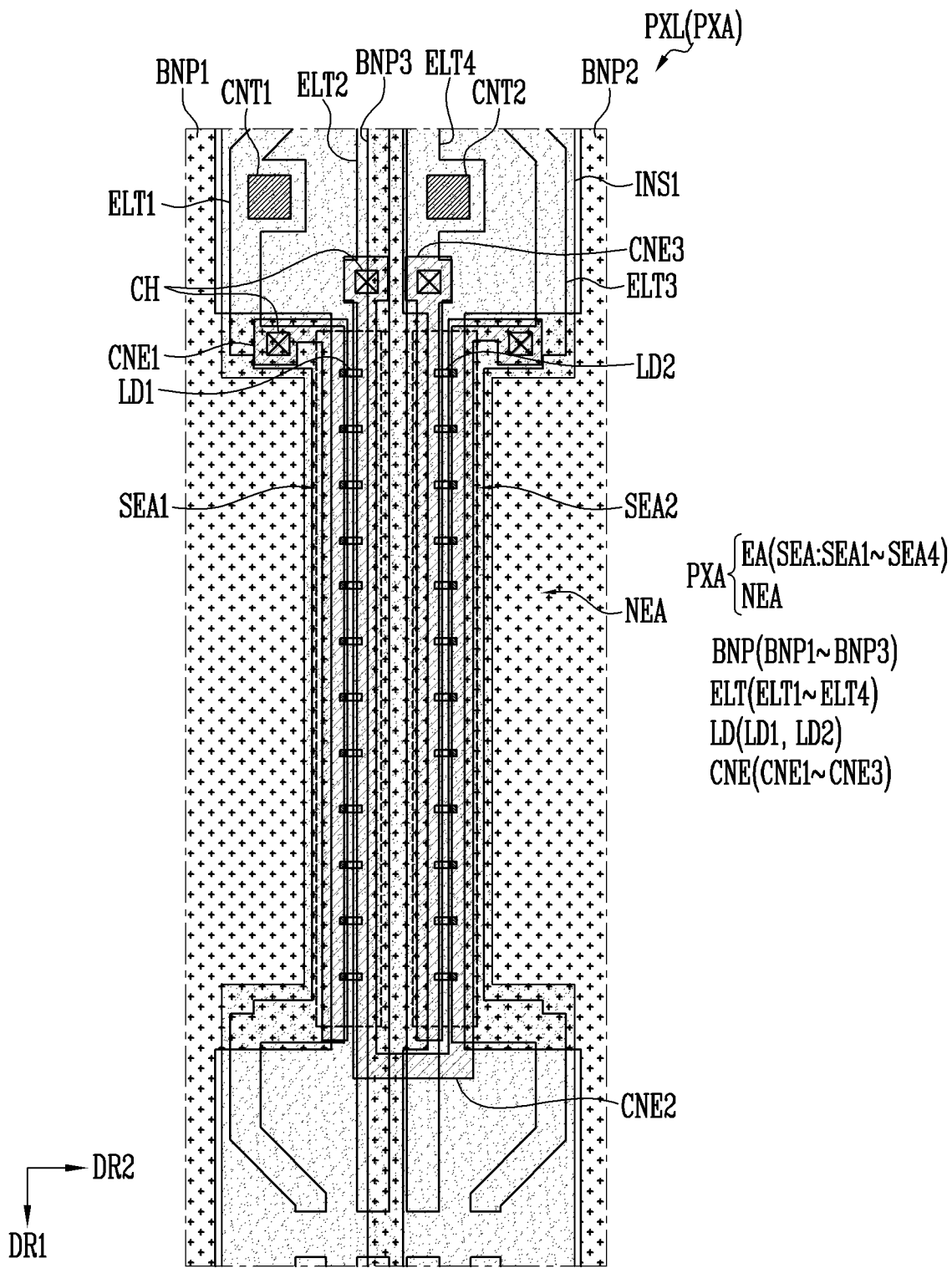
FIGS. 7-9 are plan views each illustrating a pixel in accordance with some embodiments of the present disclosure.
Figure 8:
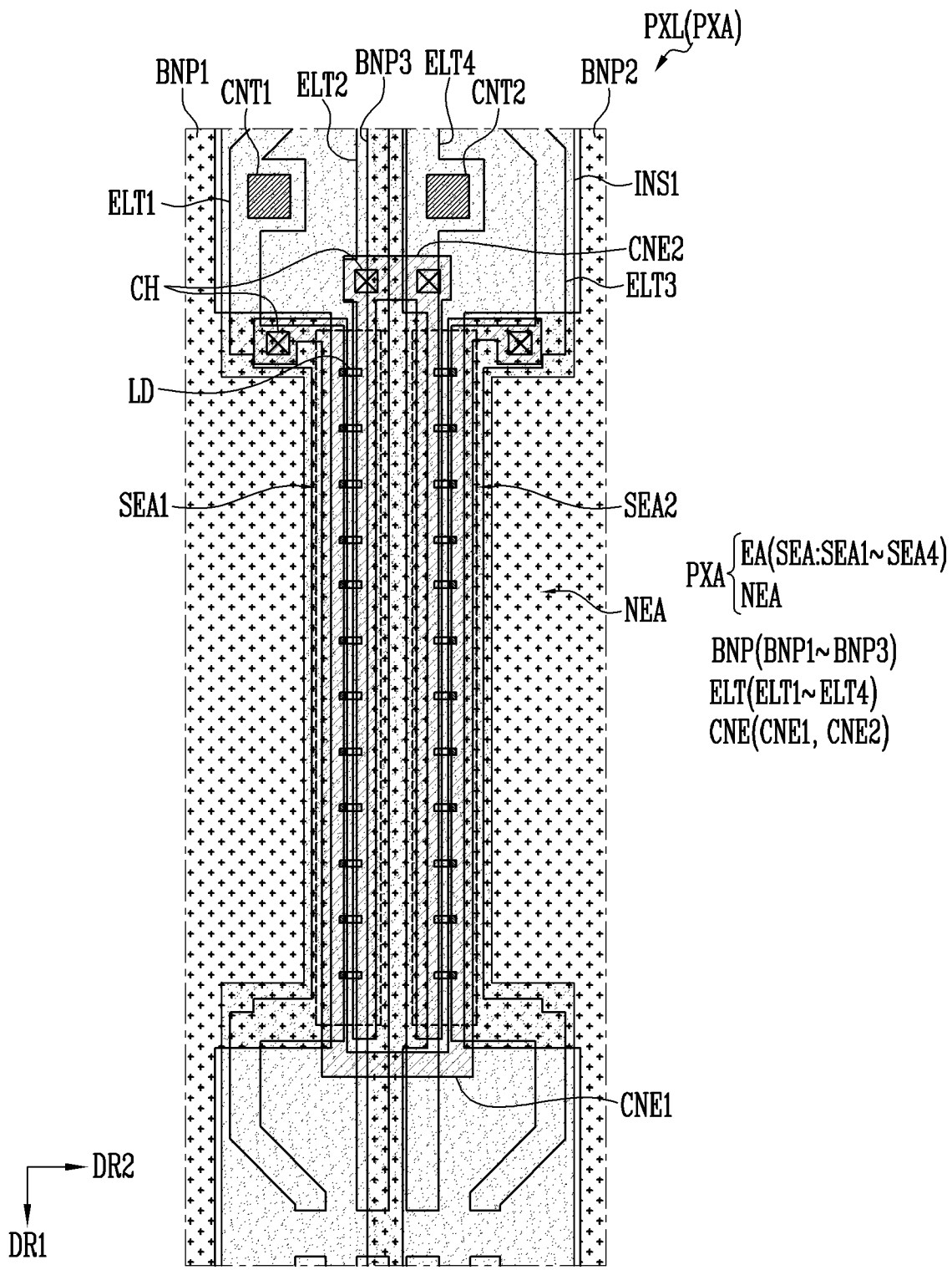
Figure 9:
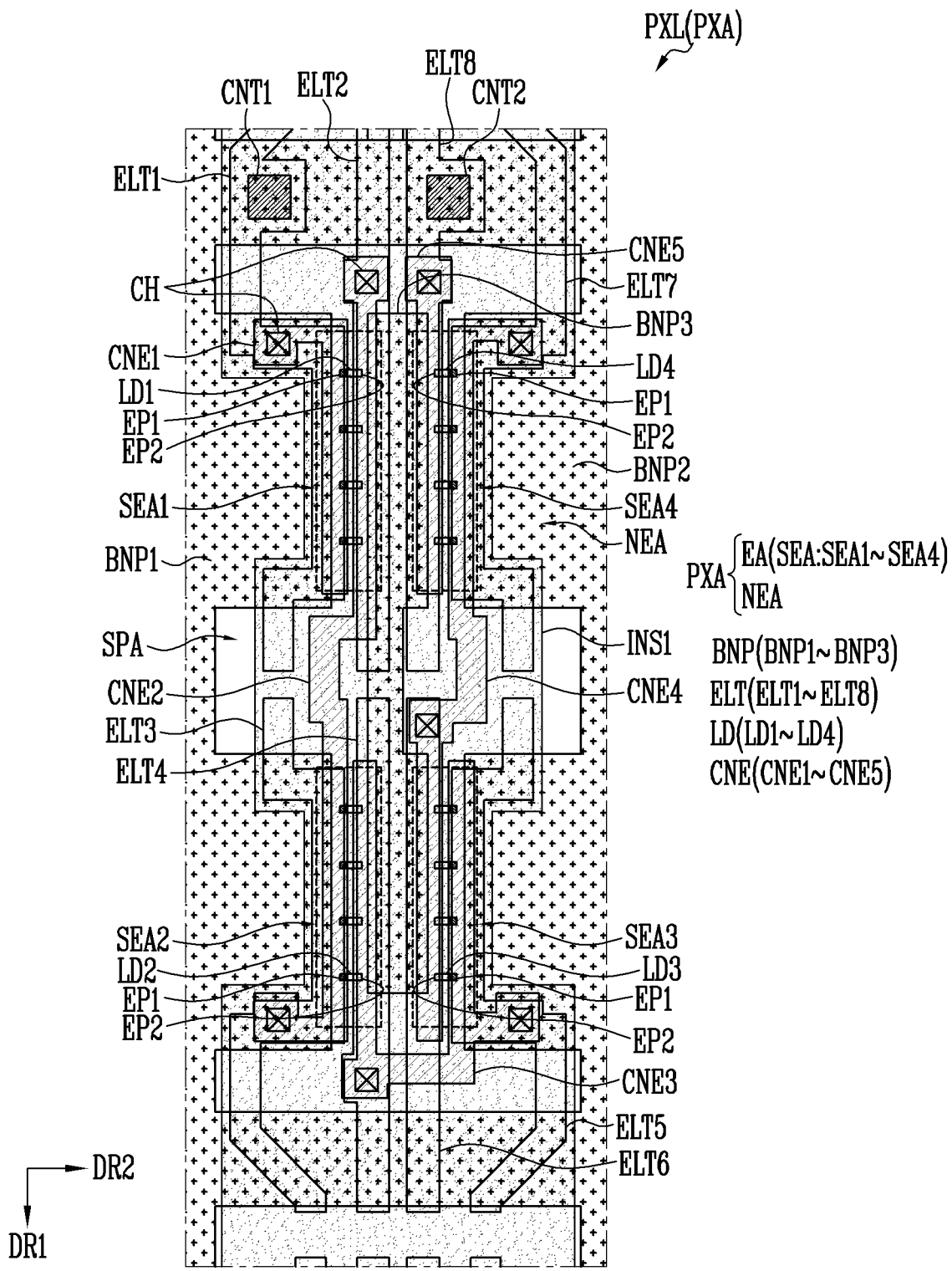

FIGS. 7-9 are plan views each illustrating a pixel PXL in accordance with some embodiments of the present disclosure, and illustrate different modifications of the pixel PXL of FIG. 4, by way of example. For example, FIGS. 7 and 8 illustrate the modification of the embodiments corresponding to FIG. 4 related to the number of the serial ports forming the light emitting unit EMU and the structure of the light emitting unit EMU, and FIG. 9 illustrates the modification of the embodiments corresponding to FIG. 4 related to the bank patterns BNP. In the description of the embodiments of FIGS. 7-9, detailed explanation of configurations similar or identical to those of FIG. 4 will be omitted.

Referring to FIG. 7, the light emitting unit EMU may be configured in a two-stage serial structure corresponding to the embodiments corresponding to FIG. 3B. In this case, each pixel area PXA may include first and second sub-emission areas SEA1 and SEA2.

The first and second electrodes ELT1 and ELT2 and the first light emitting elements LD1 may be located in the first sub-emission area SEA1. The first electrode ELT1 may be connected to the pixel circuit PXC through the first contact portion CNT1, and may be connected to the first end EP1 of the first light emitting elements LD1 by the first contact electrode CNE1. The second electrode ELT2 may be connected to the second end EP2 of the first light emitting elements LD1 and the third electrode ELT3 by the second contact electrode CNE2.

The third and fourth electrodes ELT3 and ELT4 and the second light emitting elements LD2 may be located in the second sub-emission area SEA2. The third electrode ELT3 may be connected to the first end EP1 of the second light emitting elements LD2 and the second electrode ELT2 by the second contact electrode CNE2. The fourth electrode ELT4 may be connected to the second end EP2 of the second light emitting elements LD2 by the third contact electrode CNE3, and may be connected to the second power line PL2 through the second contact portion CNT2.

Referring to FIG. 8, the light emitting unit EMU may be configured in a one-stage serial structure (i.e. parallel structure) corresponding to the embodiments corresponding to FIG. 3A. In this case, each pixel area PXA may include a single sub-emission area SEA or a plurality of sub-emission areas SEA.

For example, in the embodiments corresponding to FIG. 8, as in the embodiments corresponding to FIG. 7, the first and second electrodes ELT1 and ELT2 may be located in the first sub-emission area SEA1, the third and fourth electrodes ELT3 and ELT4 may be located in the second sub-emission area SEA2, the first and third electrodes ELT1 and ELT3 may be connected using the first contact electrode CNE1, and the second and fourth electrodes ELT2 and ELT4 may be connected using the second contact electrode CNE2. In this case, the first and third electrodes ELT1 and ELT3 may electrically constitute one electrode, and the second and fourth electrodes ELT2 and ELT4 may electrically constitute one electrode. Furthermore, the light emitting elements LD connected between the first and second electrodes ELT1 and ELT2, and the light emitting elements LD connected between the third and fourth electrodes ELT3 and ELT4 may be connected to each other in parallel.

In some embodiments, only any one of the first and third electrodes ELT1 and ELT3 may be formed, and/or only any one of the second and fourth electrodes ELT2 and ELT4 may be formed.

Referring to FIG. 9, at least some of the bank patterns BNP may be integrally connected to each other. For example, the first and second bank patterns BNP1 and BNP2 may be integrally connected in a third edge portion (e.g. upper edge portion) and a fourth edge portion (e.g. lower edge portion) of the pixel area PXA to completely enclose the emission area EA of the pixel PXL including the sub-emission areas SEA in all directions.

In the embodiments corresponding to FIG. 9, the third bank pattern BNP3 is illustrated as being separated from the first and second bank patterns BNP1 and BNP2, but the present disclosure is not limited thereto. For example, in some embodiments, the third bank pattern BNP3 may be formed to be integrally connected to the first and second bank patterns BNP1 and BNP2. In this case, the bank patterns BNP may form one integrated bank pattern.

Figure 10A:
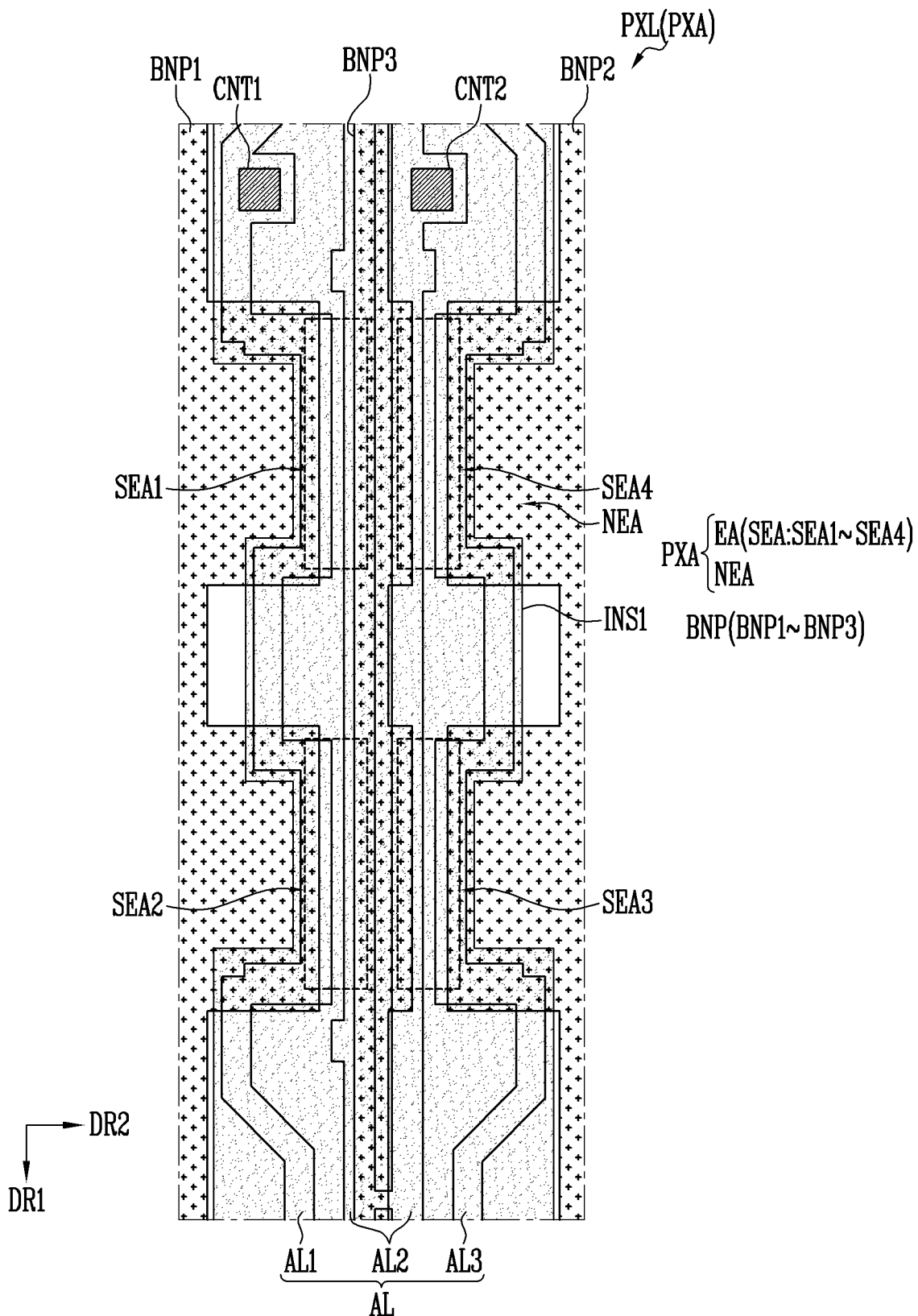
FIGS. 10A and 10B are plan views illustrating a method of manufacturing a pixel in accordance with some embodiments of the present disclosure.
Figure 10B:
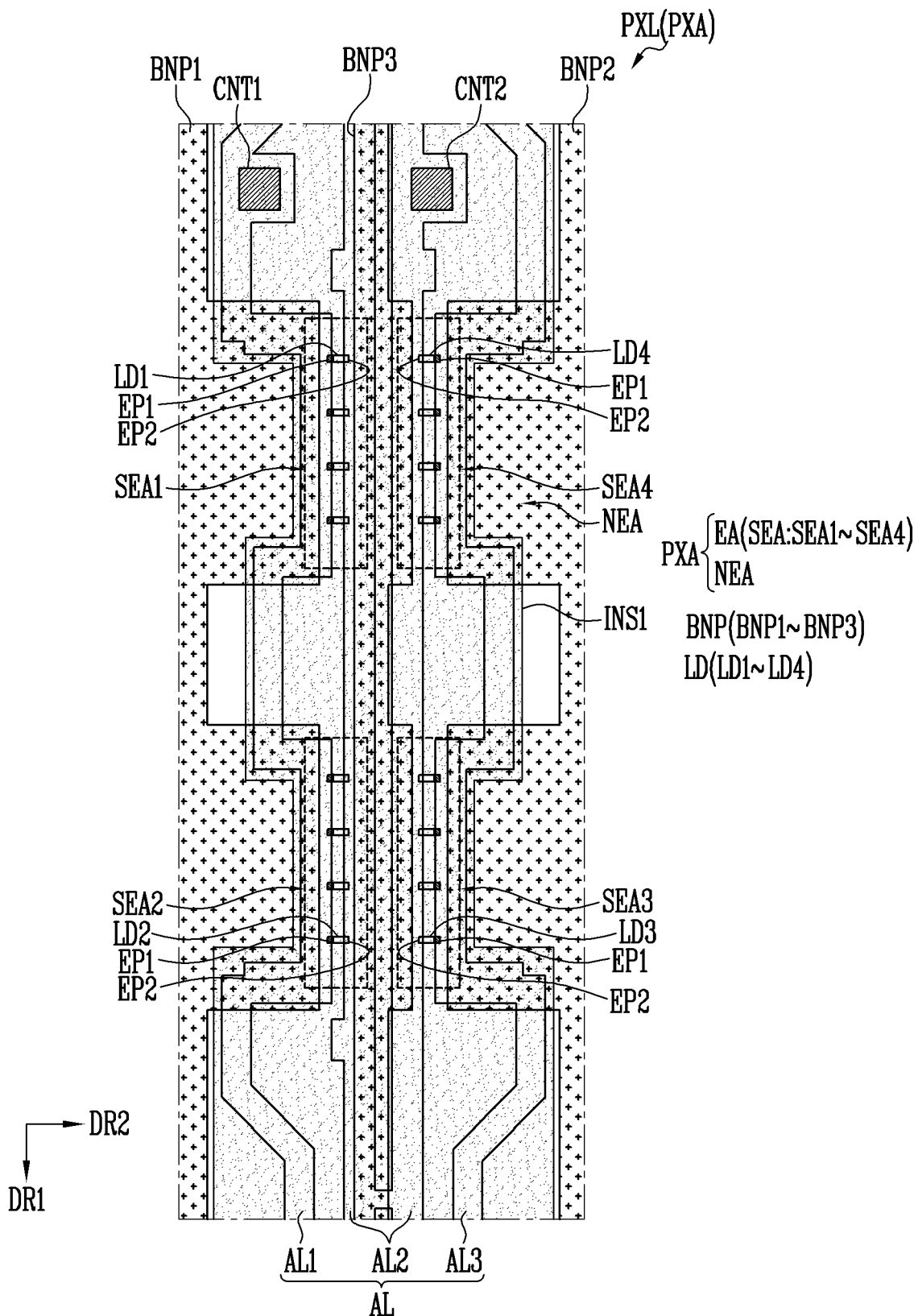

FIGS. 10A and 10B are plan views illustrating a method of manufacturing a pixel PXL in accordance with some embodiments of the present disclosure. For example, FIGS. 10A and 10B illustrate a step of supplying and aligning the light emitting elements LD, during the step of manufacturing the pixel PXL of FIG. 4.

Figure 11A:
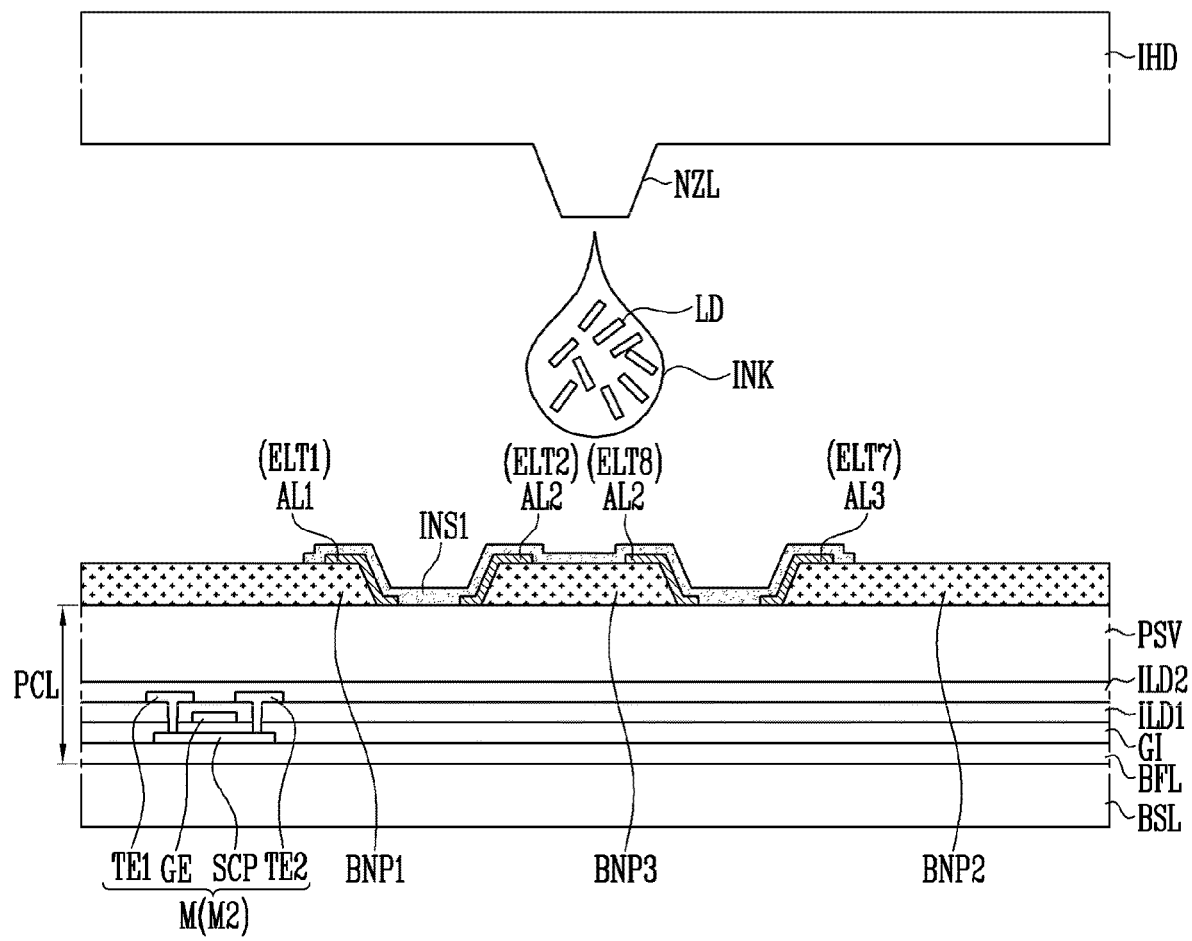
FIGS. 11A and 11B are sectional views illustrating the method of manufacturing the pixel in accordance with some embodiments of the present disclosure.
Figure 11B:
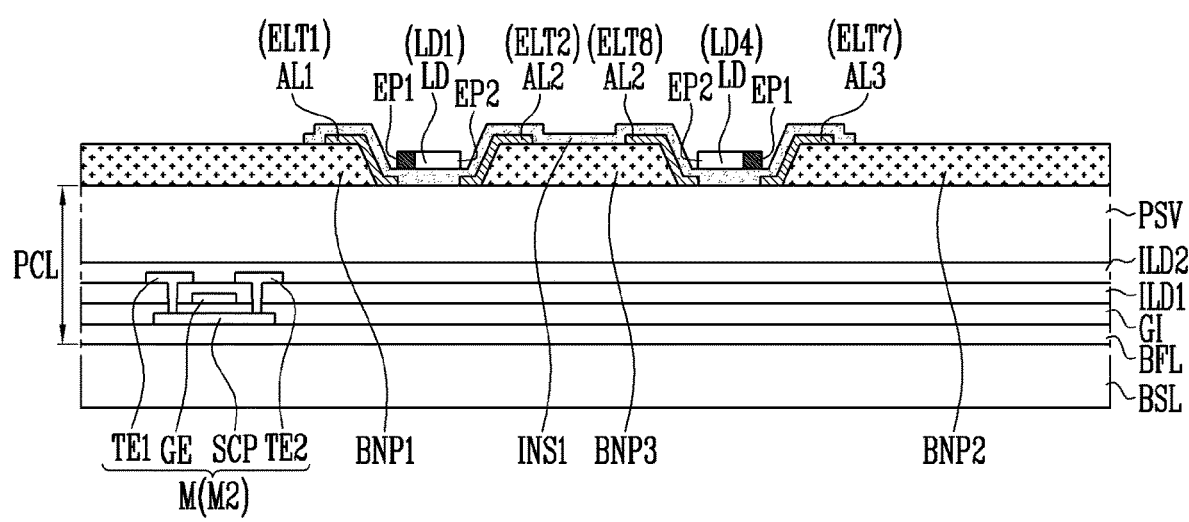

FIGS. 11A and 11B are sectional views illustrating a method of manufacturing a pixel PXL in accordance with some embodiments of the present disclosure. For example, FIGS. 11A and 11B illustrate the section of FIGS. 10A and 10B in a position taken along the line II-II' of FIG. 4.

First, referring to FIGS. 4, 10A, and 11A, the light emitting elements LD are supplied to each pixel area PXA on the base layer BSL in which the circuit layer PCL, the bank patterns BNP, the alignment lines AL, and the first insulating layer INS1 are formed.

Here, the alignment lines AL may be elements that are later separated into individual pixel electrodes ELT. For example, the pixel electrodes ELT may be first formed in the form of each alignment line AL, before being separated into individual electrodes corresponding to a serial port of the pixel PXL (e.g., a set or predetermined serial port of the pixel PXL). For example, in order to align the light emitting elements LD in each sub-emission area SEA, the pixel electrodes ELT may be divided into a plurality of groups in the entire display area DA, and the pixel electrodes ELT of each group may be first formed of an integrated alignment line AL to apply an alignment signal (e.g., a set or predetermined alignment signal).

For example, the first and third electrodes ELT1 and ELT3 of the pixels PXL may be first formed integrally in the form of the first alignment line AL1, the second, fourth, sixth, and eighth electrodes ELT2, ELT4, ELT6, and ELT8 of the pixels PXL may be first formed integrally in the form of the second alignment line AL2, and the fifth and seventh electrodes ELT5 and ELT7 of the pixels PXL may be first formed integrally in the form of the third alignment line AL3.

In some embodiments, the light emitting elements LD may be supplied to each pixel area PXA through the inkjet method. For example, an inkjet head IHD may be located above the base layer BSL, in which the circuit layer PCL, the bank patterns BNP, the alignment lines AL, and the first insulating layer INS1 are formed, so that a nozzle NZL is appropriately positioned on each pixel area PXA. Furthermore, an amount of light-emitting-element ink INK (e.g., a set or predetermined amount of light-emitting-element ink INK) including the light emitting elements LD may be supplied to each pixel area PXA through the nozzle NZL.

As described above, the area covered by the first insulating layer INS1 may exhibit hydrophilicity, and the area in which the surface of the bank patterns BNP is exposed may exhibit hydrophobicity. Thus, the supply and inflow area of the light-emitting-element ink INK may be controlled. For example, the light-emitting-element ink INK may flow into an area where the first insulating layer INS1 is formed.

When or after the light-emitting-element ink INK is supplied to each pixel area PXA, each alignment signal may be applied to each alignment line AL to form the electric field between the alignment lines AL. For example, the first alignment signal, the second alignment signal, and the third alignment signal may be applied to the first alignment line AL1, the second alignment line AL2, and the third alignment line AL3, respectively. Thus, as illustrated in FIGS. 10B and 11B, the light emitting elements LD may be aligned between the alignment lines AL.

The first and second alignment signals may be signals having different potentials and/or phases, and thereby an electric field may be formed between the first and second alignment lines AL1 and AL2 to induce the alignment of the light emitting elements LD. Likewise, the second and third alignment signals may be signals having different potentials and/or phases, and thereby an electric field may be formed between the second and third alignment lines AL2 and AL3 to induce the alignment of the light emitting elements LD.

In some embodiments, the first and third alignment signals may be the same signal or different signals. When the first and third alignment signals are different signals, the first and third alignment lines AL1 and AL3 may be formed to be separated from each other. When the first and third alignment signals are the same signal, the first and third alignment lines AL1 and AL3 may be formed to be connected to each other and thereby may be supplied with the same signal, or may be formed to be separated from each other and thereby be supplied with the same signal.

In some embodiments, in order to control the alignment direction of the light emitting elements LD, the alignment signals may be adjusted or the magnetic field may be formed. For example, the alignment signals may be adjusted or the magnetic field may be formed such that the first ends EP1 of the light emitting elements LD are directed to the first alignment line AL1 between the first and second alignment lines AL1 and AL2. Furthermore, the alignment signals may be adjusted or the magnetic field may be formed such that the first ends EP1 of the light emitting elements LD are directed to the third alignment line AL3 between the second and third alignment lines AL2 and AL3.

After the alignment of the light emitting elements LD is completed, the alignment lines AL are cut between the pixel areas PXA and/or between the sub-emission areas SEA, so that the alignment lines AL may be separated into individual pixel electrodes ELT. Furthermore, the light emitting elements LD arranged in the sub-emission areas SEA of each pixel PXL using the contact electrodes CNE may be connected in series, in parallel and/or in a series-parallel structure in a desired shape.

Figure 12:
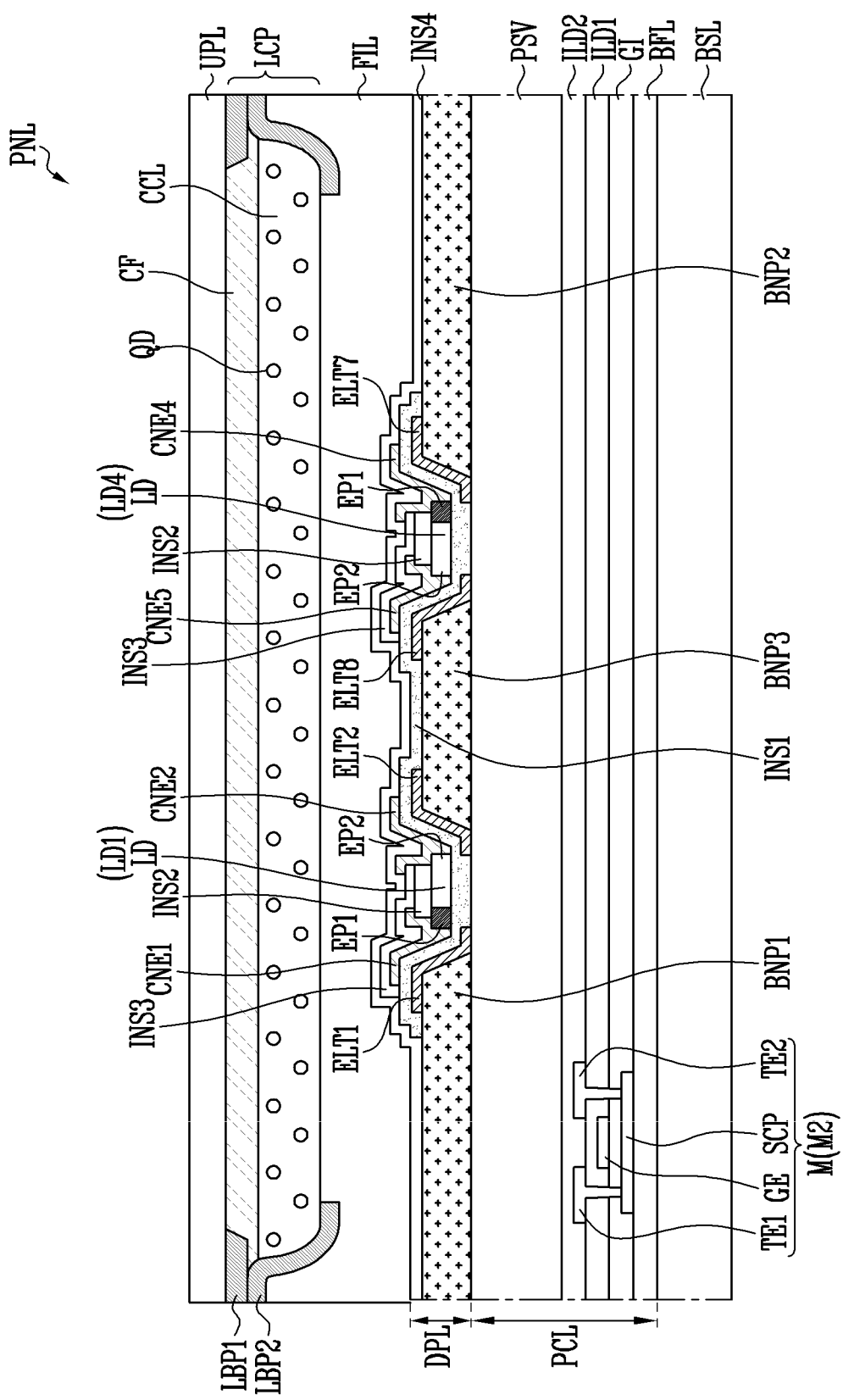
FIG. 12 is a sectional view illustrating a display device in accordance with some embodiments of the present disclosure.

FIG. 12 is a sectional view illustrating a display device in accordance with some embodiments of the present disclosure. FIG. 12 illustrate the section of the display panel PNL around an area (e.g. an area of the pixel PXL shown in FIG. 6B) in which any one pixel PXL is located. Because the structure of each pixel PXL of some embodiments has been described in detail through the above-described embodiments, a detailed description thereof will not be repeated.

Referring to FIGS. 2-12, the upper substrate UPL may be located on a surface of the base layer BSL in which the pixels PXL are formed. A light control layer LCP including a color filter CF or the like may be located on a surface of the upper substrate UPL. A filler FIL (e.g., a set or predetermined filler FIL) may be selectively filled between the pixels PXL and the upper substrate UPL.

The color filter CF may be located on a surface of the upper substrate UPL to face each pixel PXL. Such a color filter CF may include a color filter material which may selectively transmit light of a color corresponding to that of each pixel PXL. A first shielding pattern LBP1 may be located outside the color filter CF.

Although FIG. 12 illustrates embodiments in which the color filter CF is formed on the upper substrate UPL, the present disclosure is not limited thereto. For example, in some embodiments, the color filter CF may be directly formed on the surface of the base layer BSL in which the pixels PXL are formed. For example, the color filter CF may be formed on the thin encapsulation layer which seals the pixels PXL.

In some embodiments, the light control layer LCP may further include a light conversion layer CCL. The light conversion layer CCL may be located between each pixel PXL and the color filter CF, and may include color conversion particles (e.g. quantum dots QD having a color (e.g., a set or predetermined color)) for converting light of a specific color emitted from the light emitting elements LD of the pixel PXL into light of another color. A second shielding pattern LBP2 may be located outside the light conversion layer CCL.

For example, when the pixel PXL is set as a red (or green) pixel and blue light emitting elements LD are located as a light source of the pixel PXL, the light conversion layer CCL including red (or green) quantum dots QD for converting blue light into red (or green) light may be located above the pixel PXL. The red (or green) color filter CF may be located above the light conversion layer CCL.

As described above, if a separate dam structure is not formed on the pixel PXL and the supply and alignment positions of the light emitting elements LD may be controlled by the bank patterns BNP and the first insulating layer INS1, the cell gap of the display panel PNL may be reduced. Thus, the thickness of the display panel PNL may be reduced and the light efficiency may be improved.

According to embodiments of the present disclosure, a pixel and a display device including the pixel can easily control the supply and arrangement position of light emitting elements in the pixel while simplifying the manufacturing process of the pixel. Thus, it is possible to increase the utilization rate of the light emitting elements supplied to the pixel and improve the light efficiency of the pixel.

The aspects of the present disclosure are not limited by the foregoing, and other various embodiments differing from the described embodiments are anticipated herein.

While the spirit and scope of the present disclosure are described by detailed example embodiments, it should be noted that the above-described embodiments are merely descriptive and should not be considered limiting. It should be understood by those skilled in the art that various changes, substitutions, and alternations may be made herein without departing from the scope of the disclosure as defined by the following claims and their equivalents.

The scope of the present disclosure is not limited by detailed descriptions of the present disclosure, and should be defined by the accompanying claims and their equivalents. Furthermore, all changes or modifications of the present disclosure derived from the meanings and scope of the claims, and equivalents thereof should be construed as being included in the scope of the present disclosure.

What is claimed is:

1. A display device comprising:
    a base layer comprising a pixel area; and
    a pixel in the pixel area, and comprising:
        a first area;
        a second area enclosing the first area in a plan view;
        bank patterns at the pixel area, extending in a first direction, spaced from each other by a first distance in the first area, and spaced from each other by a third distance that is greater than the first distance in the second area;
        a first electrode and a second electrode at an area of the bank patterns, and spaced from each other by a second distance that is less than the first distance in the first area;
        a first insulating layer at a portion of the pixel area comprising the first area to cover the first electrode and the second electrode, and removed from another portion of the pixel area comprising opposite edge portions to expose the bank patterns; and
        a first light emitting element on the first insulating layer at the first area, and connected between the first electrode and the second electrode.

2. The display device according to claim 1, wherein the bank patterns comprise:
    a first width extended in a second direction crossing the first direction at an area corresponding to the first area, and
    a second width extended in the second direction at an area corresponding to the second area, the second width being less than the first width.

3. The display device according to claim 2, wherein the bank patterns comprise:
    a first bank pattern at a first edge portion of the pixel area, and extended from the first edge portion to the first area; and
    a second bank pattern at a second edge portion of the pixel area that is opposite to the first bank pattern, and extended from the second edge portion to the first area.

4. The display device according to claim 3, wherein the first insulating layer:
    overlaps an area of the first bank pattern and the second bank pattern at a central portion of the pixel area comprising the first area, and
    exposes another area of the first bank pattern and the second bank pattern in a remaining portion of the pixel area.

5. The display device according to claim 3, wherein the first bank pattern and the second bank pattern are integrally connected to each other in at least one of a third edge portion and a fourth edge portion of the pixel area, and completely enclose an emission area of the pixel comprising the first area in a plan view.

6. The display device according to claim 3, wherein:
    the pixel further comprises a third electrode that is opposite to the first electrode with the second electrode interposed therebetween, a fourth electrode between the second electrode and the third electrode, and a second light emitting element at the first area on the first insulating layer and connected between the third electrode and the fourth electrode,
    the first bank pattern and the second bank pattern partially overlap the first electrode and the third electrode, respectively, and
    the bank patterns further comprise a third bank pattern between the first bank pattern and the second bank pattern, and partially overlapping the second electrode and the fourth electrode.

7. The display device according to claim 1, wherein the pixel further comprises:
    a first contact electrode on the first electrode, and connecting a first end of the first light emitting element to the first electrode; and
    a second contact electrode on the second electrode, and connecting a second end of the first light emitting element to the second electrode.

8. The display device according to claim 7, wherein the first contact electrode and the second contact electrode are connected to the first electrode and the second electrode, respectively, through respective contact holes in the first insulating layer in the second area.

9. The display device according to claim 1, wherein the first area comprises:
    a first sub-emission area comprising the first electrode, the second electrode, and the first light emitting element; and
    a second sub-emission area spaced from the first sub-emission area, and comprising a third electrode, a fourth electrode, and a second light emitting element connected between the third and fourth electrodes.

10. The display device according to claim 9, wherein the pixel further comprises a contact electrode extended from the first sub-emission area to the second sub-emission area, and connecting the second electrode to the third electrode.

11. The display device according to claim 1, wherein:
    the first insulating layer comprises a hydrophilic surface, and
    the bank patterns comprises a hydrophobic surface.

12. The display device according to claim 1, wherein the first insulating layer extends in the first direction in the pixel area, and overlaps the bank patterns in a central portion of the pixel area.

13. The display device according to claim 1, wherein the first electrode and the second electrode are in the first and second areas, opposite to each other and spaced from each other by the second distance in the first area, and opposite to each other and spaced from each other by a fourth distance that is greater than the second distance in the second area.

14. The display device according to claim 13, wherein the first insulating layer has a non-uniform width within the pixel area according to shape and spacing of the first electrode and the second electrode.

15. The display device according to claim 1,
    wherein a valley is formed in a central portion of the pixel area by the bank patterns, and
    wherein the valley has a minimum width in the first area.

16. The display device according to claim 15, further comprising light emitting elements that comprise the first light emitting element within the valley in the first area.

17. The display device according to claim 1, wherein the first insulating layer completely covers the first electrode and the second electrode in the first area.

18. The display device according to claim 1, wherein the bank patterns are at a same layer on a surface of the base layer.

19. The display device according to claim 18, wherein the bank patterns are at a same height with respect to the surface of the base layer.

20. A pixel comprising:
a first area;
a second area enclosing the first area in a plan view;
bank patterns extending in a pixel area in a first direction, spaced from each other by a first distance in the first area, and spaced from each other by a third distance that is greater than the first distance in the second area;
a first electrode and a second electrode at an area of the bank patterns, and spaced from each other by a second distance that is less than the first distance in the first area;
a first insulating layer in a portion of the pixel area comprising the first area to cover the first and second electrodes, and removed from another portion of the pixel area comprising opposite edge portions of the pixel area to expose the bank patterns; and
a first light emitting element arranged in the first area on the first insulating layer, and connected between the first electrode and the second electrode.

* * * * *